United States Patent
Song

(10) Patent No.: US 8,344,619 B2
(45) Date of Patent: Jan. 1, 2013

(54) ORGANIC LIGHT-EMITTING DISPLAY APPARATUS AND METHOD OF MANUFACTURING THE SAME

(75) Inventor: Myungwon Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 664 days.

(21) Appl. No.: 12/364,005

(22) Filed: Feb. 2, 2009

(65) Prior Publication Data

US 2009/0231243 A1 Sep. 17, 2009

(30) Foreign Application Priority Data

Mar. 13, 2008 (KR) .................. 10-2008-0023413

(51) Int. Cl.
*H01J 1/62* (2006.01)
*H01J 63/04* (2006.01)

(52) U.S. Cl. .......... 313/506; 313/500; 313/504; 445/24; 257/40; 257/79; 257/80

(58) Field of Classification Search .................. 313/500, 313/504, 506; 445/24; 257/40, 79, 80
See application file for complete search history.

(56) References Cited

U.S. PATENT DOCUMENTS

| | | | |
|---|---|---|---|
| 6,384,529 B2 * | 5/2002 | Tang et al. ................ | 313/506 |
| 6,541,130 B2 * | 4/2003 | Fukuda ...................... | 428/690 |
| 7,023,013 B2 * | 4/2006 | Ricks et al. ................ | 257/40 |
| 7,247,394 B2 * | 7/2007 | Hatwar et al. ............. | 428/690 |
| 7,872,256 B2 * | 1/2011 | Sung et al. ................. | 257/40 |
| 7,947,518 B2 * | 5/2011 | Tsai et al. .................. | 438/34 |
| 2003/0044639 A1 * | 3/2003 | Fukuda ...................... | 428/690 |
| 2004/0051448 A1 | 3/2004 | Matsumoto | |
| 2004/0149984 A1 * | 8/2004 | Tyan et al. ................. | 257/40 |
| 2005/0225238 A1 | 10/2005 | Yamazaki | |
| 2005/0249972 A1 * | 11/2005 | Hatwar et al. ............. | 428/690 |
| 2005/0280008 A1 * | 12/2005 | Ricks et al. ................ | 257/79 |
| 2005/0280355 A1 | 12/2005 | Lee et al. | |
| 2006/0017377 A1 | 1/2006 | Ryu | |
| 2006/0097264 A1 | 5/2006 | Kim et al. | |
| 2007/0015429 A1 * | 1/2007 | Maeda et al. .............. | 445/24 |
| 2007/0045619 A1 | 3/2007 | Park et al. | |
| 2007/0046195 A1 | 3/2007 | Chin et al. | |

(Continued)

FOREIGN PATENT DOCUMENTS

CN 101067694 11/2007

(Continued)

OTHER PUBLICATIONS

U.S. Office action dated Mar. 21, 2011, for cross-reference U.S. Appl. No. 12/017,455, 15 pages.

(Continued)

*Primary Examiner* — Nimeshkumar Patel
*Assistant Examiner* — Thomas A Hollweg
(74) *Attorney, Agent, or Firm* — Christie, Parker & Hale, LLP

(57) ABSTRACT

Provided is an organic light-emitting display device and a method of manufacturing the same. The organic light-emitting display device includes a plurality of pixels; the pixels further include opposing first and second electrodes, and an intermediate layer disposed between the first and second electrodes. The pixels are divided into red, green, and blue sub-pixels. The intermediate layer has a thickness that varies according to the sub-pixels.

30 Claims, 17 Drawing Sheets

U.S. PATENT DOCUMENTS

2007/0216826 A1 9/2007 Lee et al.
2007/0296334 A1 12/2007 Matsuda
2008/0111474 A1* 5/2008 Sung et al. .................. 313/504

FOREIGN PATENT DOCUMENTS

| EP | 1 052 708 | 11/2000 |
|---|---|---|
| JP | 2000-323277 | 11/2000 |
| JP | 2004-207126 | 7/2004 |
| JP | 2004-228032 | 8/2004 |
| JP | 2005-093399 | 4/2005 |
| JP | 2006-41471 | 2/2006 |
| JP | 2006-269327 | 10/2006 |
| JP | 2007-67416 | 3/2007 |
| JP | 2008-28371 | 2/2008 |
| KR | 2006-7899 | 1/2006 |

OTHER PUBLICATIONS

Office Action issued in corresponding European Patent Application No. 09250716.9 dated Jul. 2, 2009.
JPO Office Action for corresponding Japanese Patent Application No. 2009-061494, dated Apr. 26, 2011.
Office Action issued by the Korean Intellectual Property Office on Apr. 30, 2009.
U.S. Appl. No. 12/017,455, filed Jan. 22, 2009, Sun-Young Lee et al., Samsung Mobile Display Co., Ltd.
Registration Determination Certificate issued Sep. 30, 2009, in corresponding Korean Patent Application No. 9-5-2009-040784075.

* cited by examiner

FIG. 3B
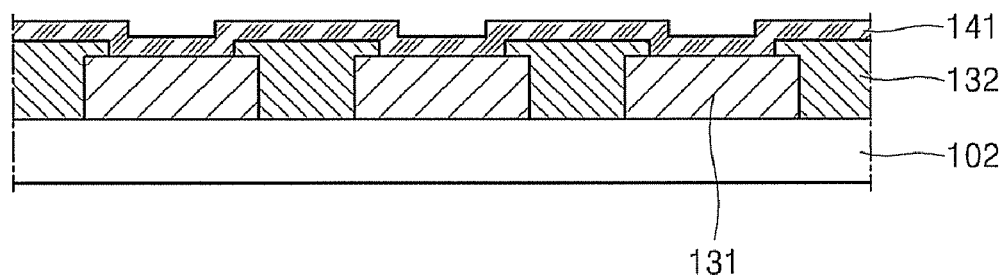
FIG. 3C
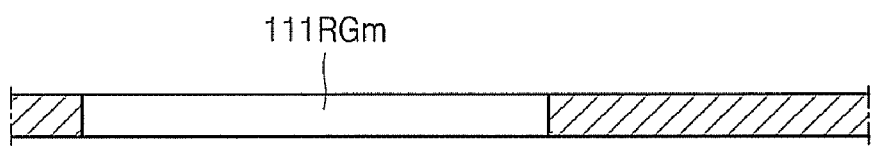
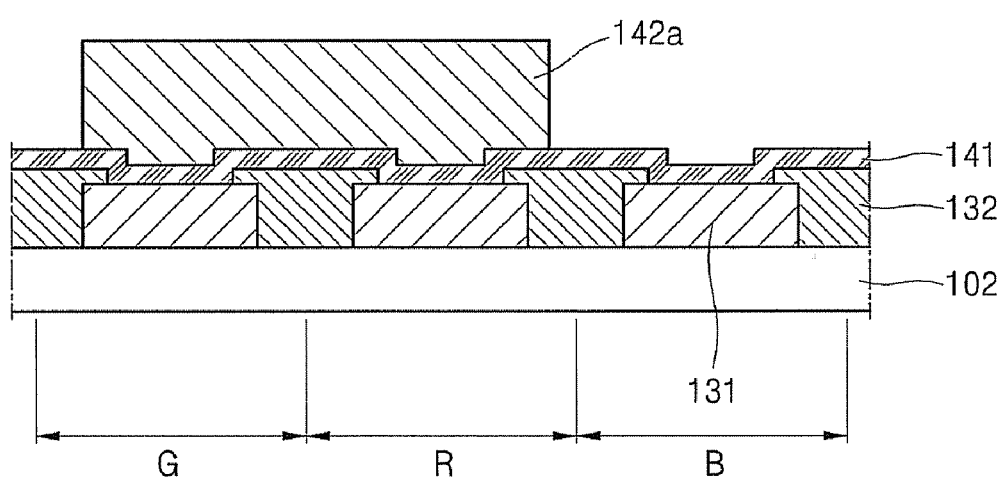

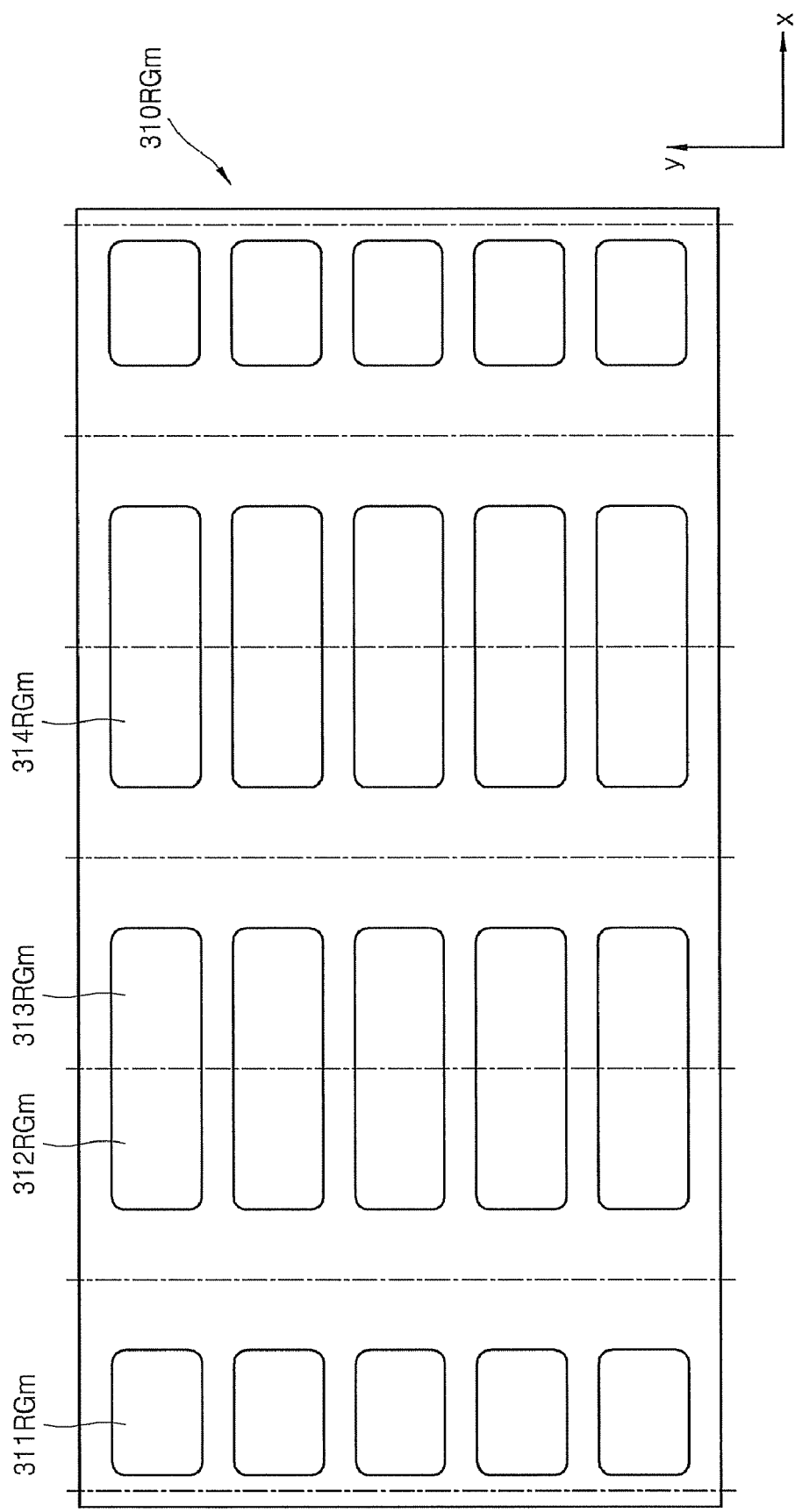

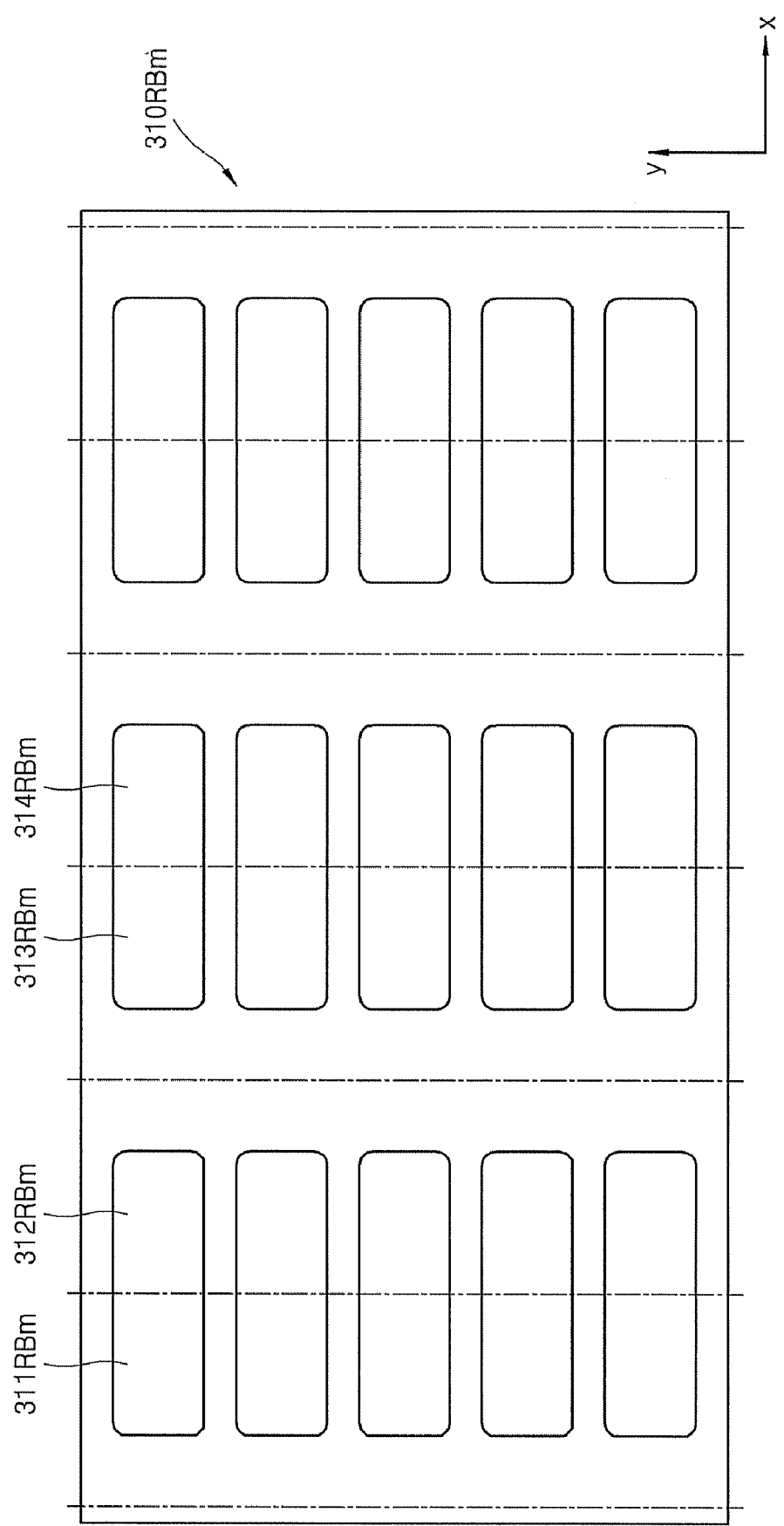

ORGANIC LIGHT-EMITTING DISPLAY APPARATUS AND METHOD OF MANUFACTURING THE SAME

CROSS-REFERENCE TO RELATED PATENT APPLICATION

This application claims the priority of Korean Patent Application No. 2008-23413 filed on Mar. 13, 2008 in the Korean Intellectual Property Office, the disclosure of which is incorporated herein in its entirety by reference.

BACKGROUND OF THE INVENTION

1. Field of the Invention

Aspects of the present invention relate to an organic light-emitting display device and a method of manufacturing the same, and more particularly, to an organic light-emitting display device including an easily and precisely deposited intermediate layer, and a method of manufacturing the same.

2. Description of the Related Art

Organic light-emitting display devices are considered to be the next-generation of display devices, since they have a wide viewing angle, a high contrast, and a quick response speed. In general, an organic light-emitting display device has a stacked structure, in which an emission layer is interposed between an anode and a cathode. A color display can thereby be realized based on a principle that light is emitted by reuniting holes injected from the anode and electrons injected from the cathode on the emission layer. However, such a structure makes it difficult to achieve efficient light emission. Thus, intermediate layers, such as an electron injection layer, an electron transport layer, a hole transport layer, and a hole injection layer, are selectively inserted between each of the electrodes and the emission layer.

However, it difficult to finely pattern a thin organic layer, such as an emission layer, or an intermediate layer, and the luminous efficiencies of red, green, and blue sub-pixels depend on the organic layers being precisely patterned. Thus, a conventional organic light-emitting display device should be improved since it is difficult to achieve a desirable driving voltage, current density, brightness, color purity, luminous efficiency, and lifetime.

An organic light-emitting display device can also be structured to include an emission layer and an intermediate layer between a first electrode and a second electrode. In this case, the first and second electrodes and the intermediate layer may be fabricated in various ways, e.g., by a deposition method. In order to manufacture an organic light-emitting display device according to the deposition method, a thin layer is formed in a predetermined pattern by closely adhering a mask, having the same pattern as the thin layer, to a plane on which the thin layer is to be formed, and then depositing a material for the thin layer on the resultant structure.

FIG. 1A is a plan view schematically illustrating an emission layer/intermediate layer pattern of a conventional organic light-emitting display device 10. FIG. 1B is a plan view schematically illustrating a mask 10Bm for depositing a blue emission layer of the conventional organic light-emitting display device 10. Referring to FIGS. 1A and 1B, pixels 11, 12, 13, and 14 of the conventional organic light-emitting display device 10 respectively include a plurality of emission layers 11R, 12R, 13R, 14R, 11G, 12G, 13G, 14G, 11B, 12B, 13B, and 14B that emit red, green, or blue light. Three sub-pixels respectively emitting red, green, and blue light from one pixel.

As described above, the emission layers 11R through 14B of the pixels 11 through 14 are formed through deposition using a mask. For example, the emission layers of red sub-pixels are simultaneously formed through deposition, the emission layers of green sub-pixels are simultaneously formed through deposition, and then the emission layers of blue sub-pixels are simultaneously formed through deposition. Thus, the conventional mask 10Bm having a plurality of openings 11Bm, 12Bm, 13Bm, and 14Bm, as illustrated in FIG. 1B, is used to obtain a blue emission layer pattern of the conventional organic light-emitting display device 10, as illustrated in FIG. 1A. Also, a mask having a plurality of openings formed at the same intervals as in the conventional mask 10Bm needs to be used in order to form each red and green emission layer pattern of the organic light-emitting display device 10.

Since the intermediate layer is also formed in the same pattern as the emission layer, a mask having a plurality of openings formed at the same intervals as in the conventional mask 10Bm needs to be used in order to obtain an intermediate layer pattern of the organic light-emitting display device 10. However, as the distances between sub-pixels become smaller, in order to manufacture high-definition display devices, the sizes of the openings of the masks become smaller. That is, referring to FIG. 1B, the widths l0 of the openings 11Bm through 14Bm become smaller. Thus, a mask having smaller openings is used in order to realize a high-definition organic light-emitting display device. However, there is a limit as to how fine-pitched a mask can be.

Also, as a mask pattern becomes finer, it is more difficult to pattern the mask and align the mask with respect to a region on which an emission layer/intermediate layer is to be deposited. Even a slight error may cause an emission layer to overlap an adjacent emission layer. Furthermore, display devices, other than an organic light-emitting display device, manufactured through such deposition also have the above-described disadvantages.

SUMMARY OF THE INVENTION

Aspects of the present invention provide a display device in which an intermediate layer of each sub-pixel can be easily and precisely deposited.

According to an aspect of the present invention, there is provided an organic light-emitting display device including a plurality of pixels. Each of the pixels comprises a red, a green, and a blue sub-pixel. The display device includes an intermediate layer that is formed to different thicknesses in the respective sub-pixels.

According to aspects of the present invention, in each pixel, the red sub-pixel may be arranged between the blue and green sub-pixels. The thickness of the intermediate layer may be at a maximum in the red sub-pixels.

According to aspects of the present invention, the sum of the thickness of the intermediate layer of the green sub-pixel and the thickness of the intermediate layer of the blue sub-pixel may be substantially equal to the thickness of the intermediate layer in the red sub-pixel.

According to aspects of the present invention, an intermediate layer may be formed as one piece within each of the pixels.

According to aspects of the present invention, each of the sub-pixels may further comprise: opposing first and second electrodes; an intermediate layer disposed between the electrodes; and red, green, and blue emission layers disposed within the intermediate layer. The thickness of the intermediate layer in a region having the red emission layer is greater than of at least one of a region having the green emission layer and a region having the blue emission layer.

According to aspects of the present invention, the sub-pixels included in the adjacent pixels may be arranged such that the respective sub-pixels of a pixel are symmetrical with respect to a boundary between the adjacent pixels.

According to aspects of the present invention, an intermediate layer may be formed as one piece, and can extend across adjacent pixels.

According to aspects of the present invention, the intermediate layer may comprise: a hole injection layer formed within each of the pixels to a generally constant thickness; and a hole transport layer formed on the hole injection layer, having a thickness that varies according to the respective sub-pixels.

According to aspects of the present invention, the intermediate layer may comprise: a hole injection layer having a thickness that varies according to the respective sub-pixels; and a hole transport layer formed on the hole injection layer, having a uniform thickness.

According to aspects of the present invention, the intermediate layer may comprise: a hole injection layer having a thickness that varies according to the respective sub-pixels; and a hole transport layer formed on the hole injection layer, having a thickness that varies according to the respective sub-pixels.

According to aspects of the present invention, the intermediate layer may comprise an electron transport layer having a thickness that varies according to the respective sub-pixels.

According to another aspect of the present invention, there is provided a method of manufacturing an organic light-emitting display device having a plurality of pixels, each having red, green, and blue sub-pixels, the method comprising: forming a plurality of first electrodes on a surface of a substrate; forming an emission layer and an intermediate layer on the first electrode, together having a thickness that varies according to the respective sub-pixels; and forming a plurality of second electrodes on the emission layer and the intermediate layer.

According to aspects of the present invention, the forming of the intermediate layer may comprise: depositing a first portion of the intermediate layer in a first region; and depositing a second portion of the intermediate layer in a second region, which partly overlaps the first region.

According to aspects of the present invention, the forming of the emission layer may comprise forming a red emission layer in a region where the first region and the second region overlap each other.

According to aspects of the present invention, the forming of the intermediate layer may comprise: forming the intermediate layer, as one piece, in a region having the red and green sub-pixels; and forming the intermediate layer, as one piece, in a region having the red and green sub-pixels.

According to aspects of the present invention, the forming of the intermediate layer, as one piece, in the region having the red and green sub-pixels, comprises patterning the intermediate layer by using a first mask in which the region having the red and green sub-pixels is formed as one opening.

According to aspects of the present invention, the forming of the intermediate layer, as one piece, in the region having the red and blue sub-pixels, may comprise patterning the intermediate layer by using a second mask in which the region having the red and blue sub-pixels is formed as one opening.

According to aspects of the present invention, the forming of the intermediate layer may comprise forming an intermediate layer, as one piece, within each of the pixels.

According to aspects of the present invention, the forming of the emission layer and the intermediate layer may comprise: forming an intermediate layer on the first electrode, such that the thickness of a part of the intermediate layer varies according to sub-pixels; and forming an emission layer on the intermediate layer.

According to aspects of the present invention, the forming of the intermediate layer may comprise: forming a hole injection layer on the first electrode to a generally constant thickness; and forming a hole transport layer on the hole injection layer, such that the thickness of a part of the hole transport layer varies according to sub-pixels.

According to aspects of the present invention, the forming of the intermediate layer may comprise: forming a hole injection layer on the first electrode, such that the thickness of a part of the hole injection layer varies according to sub-pixels.

According to aspects of the present invention, the forming of the intermediate layer may comprise: forming a hole injection layer on the first electrode, such that the thickness of the hole injection layer varies according to sub-pixels; and forming a hole transport layer on the hole injection layer, such that the thickness of the hole transport layer varies according to the sub-pixels.

According to aspects of the present invention, the forming of the emission layer and the intermediate layer may comprise: forming an emission layer on the first electrode; and forming an intermediate layer on the emission layer, such that the thickness the intermediate layer varies according to sub-pixels.

According to aspects of the present invention, the forming of the intermediate layer may comprise forming an electron transport layer on the emission layer, such that the thickness of the electron transport layer varies according to sub-pixels.

According to another aspect of the present invention, there is provided an organic light-emitting display device comprising: a substrate; opposing first and second electrodes disposed on the substrate; an intermediate layer disposed between the electrodes; and a plurality of emission layers disposed in the intermediate layer. A red emission layer is arranged between blue and green emission layers at the center of one pixel. The thickness of an intermediate layer is at a maximum adjacent to the red emission layer.

According to aspects of the present invention, the intermediate layer may comprise at least one of a hole injection layer, a hole transport layer, and an electron transport layer.

According to aspects of the present invention, the intermediate layer may be formed as one piece within each pixel.

According to aspects of the present invention, the first electrode may be a reflective electrode, and the second electrode may be a semi-transparent electrode or a transparent electrode.

According to aspects of the present invention, a resonance may occur between the first electrode and the second electrode when the device is driven.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments taken in conjunction with the accompanying drawings of which:

FIGS. 3A through 3E are cross-sectional views sequentially illustrating a method of manufacturing the organic light-emitting display device according to the first exemplary embodiment of the present invention;

FIG. 10B is a plan view schematically illustrating a mask for depositing red-green intermediate layers of the organic light-emitting display device of FIG. 10A according to an exemplary embodiment of the present invention;

FIG. 10C is a plan view schematically illustrating a mask for depositing red-blue intermediate layers of the organic light-emitting display device of FIG. 10A according to an exemplary embodiment of the present invention;

DETAILED DESCRIPTION OF THE EMBODIMENTS

Figure 1A:
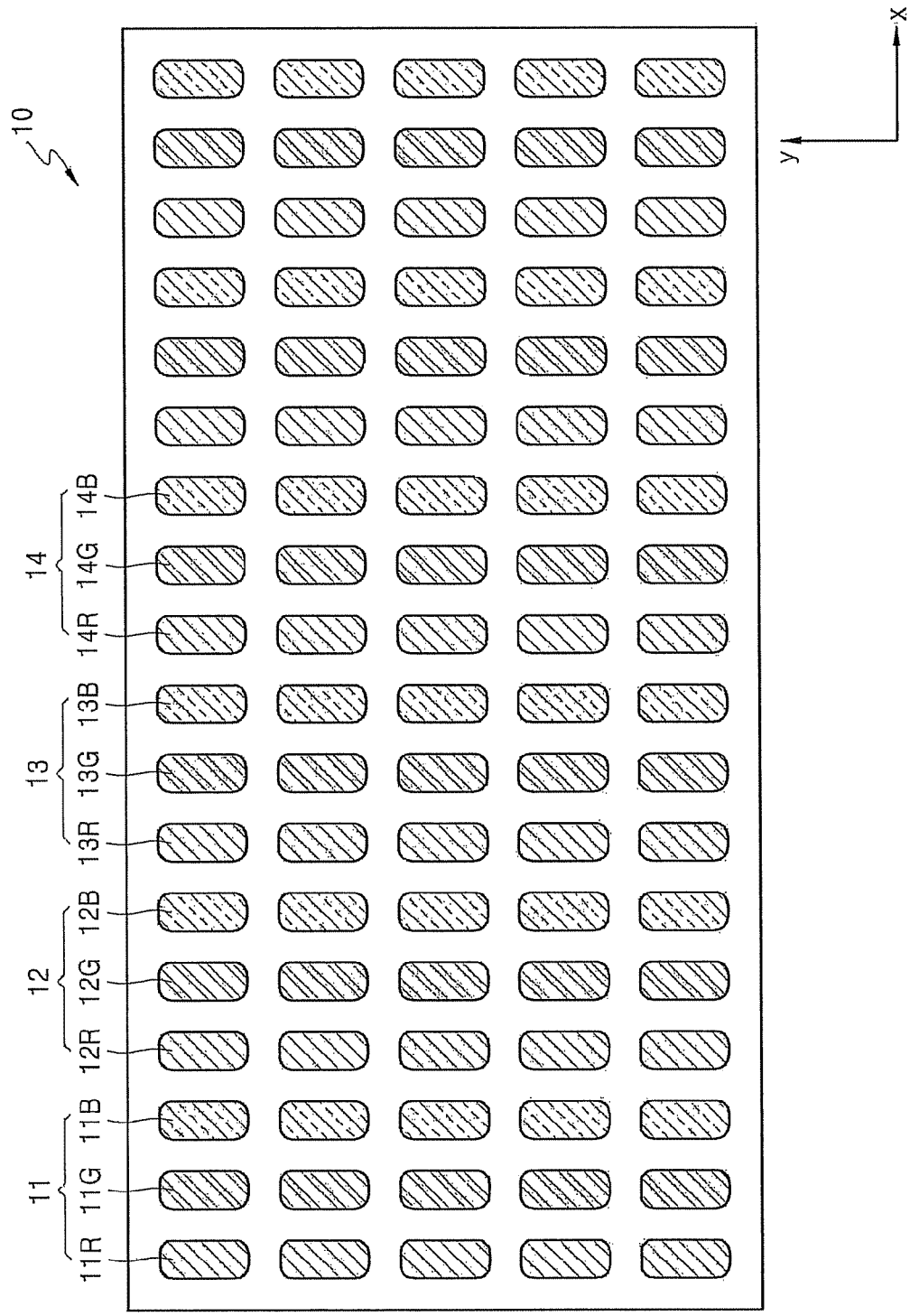
FIG. 1A is a plan view schematically illustrating an emission layer/intermediate layer pattern of a conventional organic light-emitting display device.

Reference will now be made in detail to the exemplary embodiments of the present invention, examples of which are illustrated in the accompanying drawings, wherein like reference numerals refer to the like elements throughout. The exemplary embodiments are described below by referring to the figures. As referred to herein, when a first element is said to be disposed or formed "on," or "adjacent to," a second element, the first element can directly contact the second element, or can be separated from the second element by one or more other elements. In contrast, when an element is referred to as being disposed "directly on" another element, there are no intervening elements present. As used herein, the term "and/or" includes any and all combinations of one or more of the associated listed items.

Figure 2:
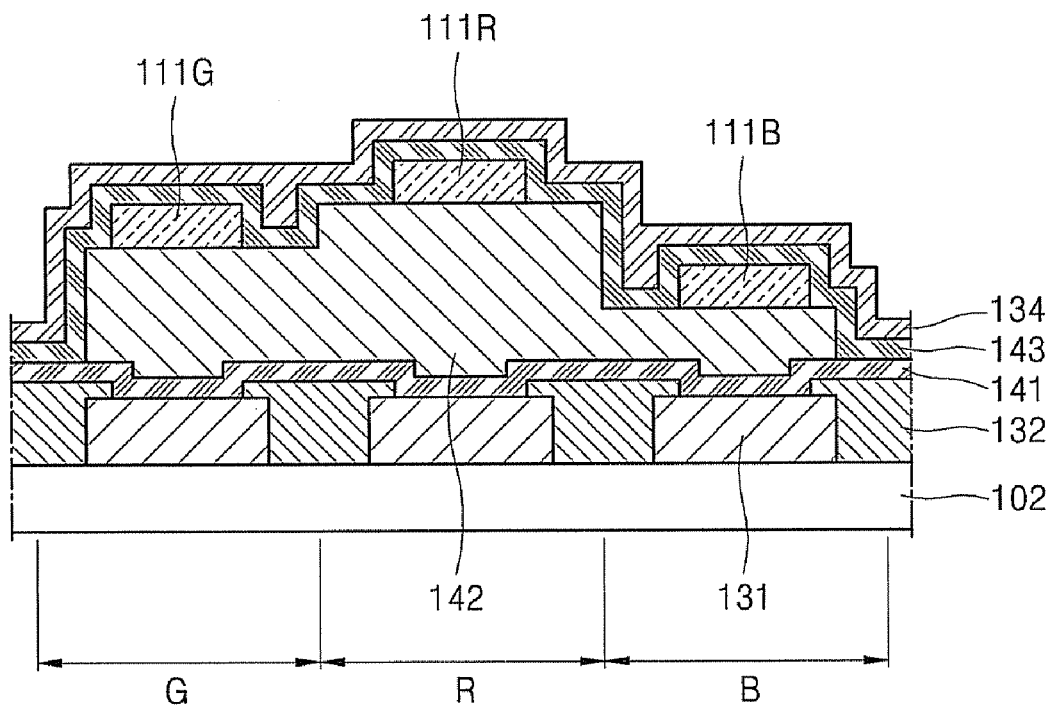
FIG. 2 is a cross-sectional view of an organic light-emitting display device according to a first exemplary embodiment of the present invention.

FIG. 2 is a cross-sectional view of an organic light-emitting display device according to a first exemplary embodiment of the present invention. Referring to FIG. 2, the organic light-emitting display device includes a substrate 102, first electrodes 131, an insulating layer 132, second electrodes 134, emission layers (EML): 111R (red emission layer), 111G (green emission layer), and 111B (blue emission layer), and an intermediate layer that is formed on the top and/or bottom of the emission layers 111R, 111G, and 111B. The intermediate layer includes a hole injection layer (HIL) 141, a hole transport layer (HTL) 142, and an electron transport layer (ETL) 143. The emission layers: 111R, 111G, and 111B, the HIL 141, HTL 142, and ETL 143 are formed between the first electrodes 131 and the second electrodes 134. The emission layers 111R, 111G, and 111B may emit red, green, or blue light, according to a material thereof, respectively.

The first electrodes 131 are patterned on the substrate 102. Then, the insulating layer 132 is formed to fill gaps between the first electrodes 131, thus defining pixel regions. The HIL 141, the HTL 142, the emission layers: 111R, 111G, and 111B, the ETL 143, and an electron injection layer (EIL) (not shown) are deposited on the first electrodes 131 as a single or a composite structure. Then, the second electrodes 134 are formed on the ETL 143.

One of the first electrodes 131 or the second electrodes 134 are reflective electrodes, and the others are semi-transparent or transparent electrodes. Thus, a resonance may occur between the first electrodes 131 and the second electrodes 134 when the organic light-emitting display device is driven. Thus, light generated by the emission layers 111R, 111G, and 111B, when the organic light-emitting display device is driven, is emitted outside the organic light-emitting display device while resonating between the first electrode 131 and the second electrode 134. Accordingly, the brightness and efficiency of light emission may be improved.

More specifically, the first electrodes 131 may be formed on a surface of the substrate 102. In the present exemplary embodiment, the first electrodes 131 may be reflective electrodes, and the second electrodes 134 may be semi-transparent or transparent electrodes. Thus, light generated by the emission layers 111R, 111G, and 111B may be emitted outside the organic light-emitting display device (in the opposite direction of the substrate 102), via the second electrodes 134, while resonating between the first and second electrodes 131 and 134.

An intermediate layer of an organic light-emitting display device according to an exemplary embodiment of the present invention may include the HIL 141 or the HTL 142, or may include a single layer having hole injection and transport characteristics.

The organic light-emitting display device according to the first exemplary embodiment is manufactured in such a manner that an intermediate layer including the HIL 141 or the HTL 142 is deposited at different thicknesses on different sub-pixels. More specifically, the HTL 142 may be formed to a thickness of 1600 Å to 2200 Å in a red sub-pixel R. If the thickness of the HTL 142 in the red sub-pixel R is less than 1600 Å or greater than 2200 Å, the emission layer 111R may not have appropriate hole injection characteristics and/or hole transport characteristics so as to cause the resonance, and thus, the degree of color purity and the luminous efficiency may be degraded. If the thickness of the HTL 142 in the red sub-pixel R is greater than 2200 Å, a driving voltage may increase.

In a green sub-pixel G, the HTL 142 may be formed to a thickness of 1000 Å to 1200 Å. If the thickness of the HTL 142 in the green sub-pixel G is less than 1000 Å or greater than 1200 Å, the emission layer 111G may not have appropriate hole injection characteristics and/or hole transport characteristics to cause the resonance, and thus, the degree of color purity and the luminous efficiency may be degraded. If the thickness of the HTL 142 in the green sub-pixel G is greater than 1200 Å, the driving voltage may increase.

In a blue sub-pixel B, the HTL 142 may be formed to a thickness of 100 Å to 500 Å. If the thickness of the HTL 142 in the blue sub-pixel B is less than 100 Å or greater than 500 Å, the emission layer 111B may not have appropriate hole injection characteristics and/or hole transport characteristics to cause the resonance, and thus, the degree of color purity and the luminous efficiency may be degraded. If the thickness of the HTL 142 in the blue sub-pixel B is greater than 500 Å, the driving voltage may increase.

In the present exemplary embodiment, the HTL 142 is formed, as one piece, in the red sub-pixel R and the green sub-pixel G, and then is formed again, as one piece, in the red sub-pixel R and a blue sub-pixel B. That is, the HTL 142 is deposited on the green and blue sub-pixels G and B only once, but is deposited on the red sub-pixel R twice. Thus, the thickness of the HTL 142 in the red sub-pixel R is greater than in the green and blue sub-pixels G and B. In other words, the thickness of the HTL 142 in the red sub-pixel R is substantially equal to the sum of the thickness of the HTL 142 in the green sub-pixel G and the thickness of the HTL 142 in the blue sub-pixel B. Also, the HTL 142 may be formed as one piece within one pixel.

As described above, in an organic light-emitting display device according to an exemplary embodiment of the present invention, resonance may occur between first and second electrodes when the organic light-emitting display device is driven. In this case, the thickness of a hole transport layer varies according to the color of light emitted from an emission layer, thereby achieving good driving voltage, current density, brightness of light emission, degree of color purity, luminous efficiency, lifetime, and so on.

FIGS. 3A through 3E are cross-sectional views schematically and sequentially illustrating a method of manufacturing the organic light-emitting display device according to the first exemplary embodiment of the present invention. Referring to FIGS. 3A through 3E, the method includes forming the first electrodes 131 on the surface of the substrate 102, forming the HTL 142 on the first electrodes 131, so that the thickness of a part of the HTL 142 is greater than that of the remaining part thereof, forming the emission layers 111G, 111R, and 111B on the HTL 142, and forming second electrodes 134 on the emission layers 111G, 111R, and 111B.

Figure 3A:
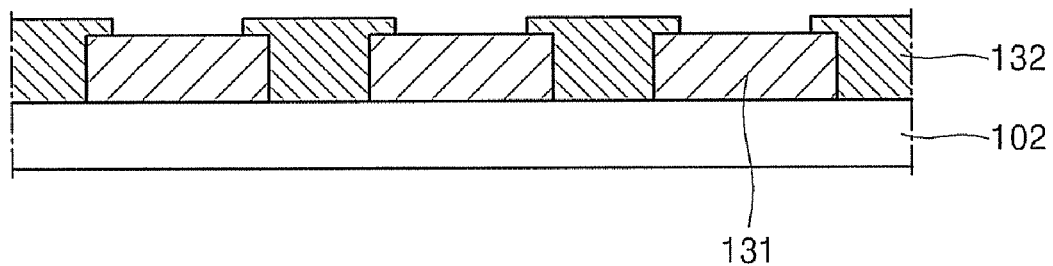

More specifically, as illustrated in FIG. 3A, the first electrodes 131 are formed on the substrate 102. The substrate 102 can be any substrate used in the field of general organic light-emitting devices. For example, various types of substrates, such as a glass substrate or a plastic substrate, can be used in consideration of transparency, smoothness, tractability, water-resistance, and so on.

The first electrodes 131 may be reflective electrodes, semi-transparent electrodes, or transparent electrodes formed using a conductive metal material selected from the group consisting of lithium (Li), magnesium (Mg), aluminum (Al), an aluminum-lithium alloy (Al—Li), calcium (Ca), a magnesium-indium alloy (Mg—In), a magnesium-silver alloy (Mg—Ag), and a calcium-aluminum alloy (Ca—Al), or a metal oxide material selected from the group consisting of an indium tin oxide (ITO), an indium zinc oxide (IZO), and an indium oxide ($IN_2O_3$). Otherwise, the first electrodes 131 may be formed using a combination of two or more materials selected from the conductive metals and the metal oxides.

The insulating layer 132 is formed in a region in which an organic layer is to be formed. The insulating layer 132 can be formed in various ways (including a deposition method or a coating method) using an inorganic substance (such as a silicon oxide and a nitride) or an insulating organic substance.

As illustrated in FIG. 3B, the HIL 141 is formed on the first electrodes 131 and the insulating layer 132 to a predetermined thickness. The HIL 141 can be formed by various known methods, including a vacuum deposition method, a spin-coating method, a casting method, or a Langmuir-Blodget (LB) method.

Figure 3D:
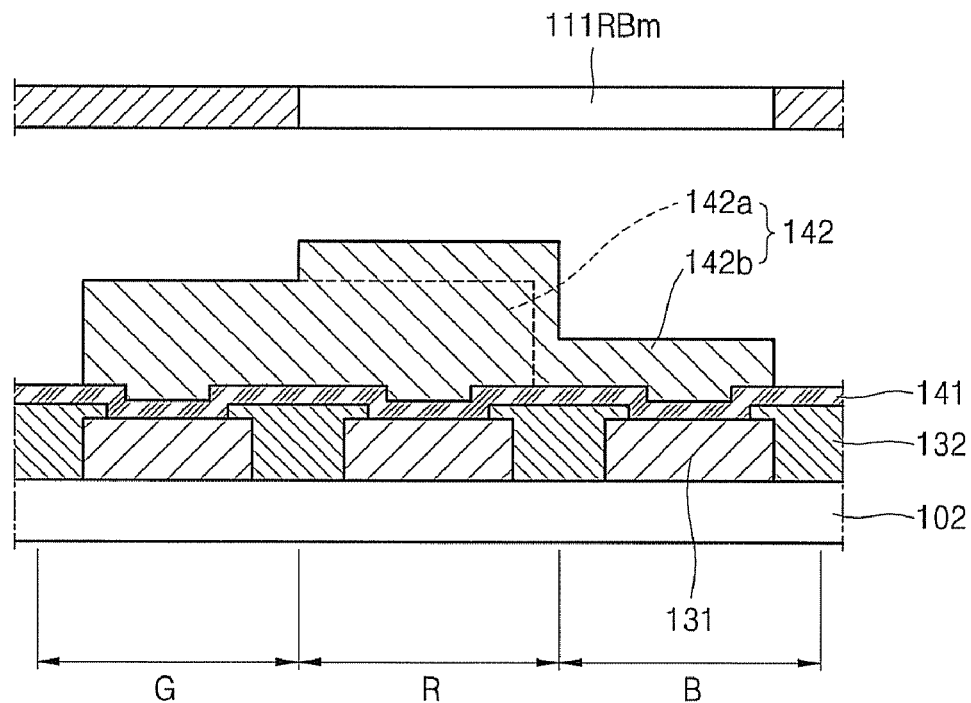

As illustrated in FIG. 3C, a first HTL 142a is formed on the HIL 141, as one piece, in the red sub-pixel R and the green sub-pixel G. Then, as illustrated in FIG. 3D, a second HTL 142b is formed on the HIL 141, as one piece, in the red sub-pixel R and the blue sub-pixel B.

In detail, as the distances between sub-pixels become smaller, in order to manufacture high-definition display devices, the sizes of openings of a mask for depositing emission layers/intermediate layers of the sub-pixels also becomes smaller. Thus, a fine-pitch mask having smaller openings is used in order to realize a high-definition organic light-emitting display. However, there is a limit to the pitch of the mask.

In order to solve the above problem, according to an embodiment of the present invention, an intermediate layer is deposited, as one piece, in two adjacent sub-pixel regions, i.e., in the red sub-pixel R and the green sub-pixel G, and on the red sub-pixel R and the blue sub-pixel B.

The optimal thickness of an intermediate layer varies according to the type of emission layer. The intermediate layer is the thickest at the red sub-pixel R. The green sub-pixel G and the blue sub-pixel B are arranged on either side of the red sub-pixel R. Then, an intermediate layer is formed, as one piece, in the red sub-pixel R and the green sub-pixel G, and then is formed again, as one piece, in the red sub-pixel R and the blue sub-pixel B. That is, the intermediate layer is formed only once in the green sub-pixel G and the blue sub-pixel B, but is formed twice in the red sub-pixel R. Accordingly, the thickness of the intermediate layer in the red sub-pixel R is greater than in the green and blue sub-pixels G and B. In other words, the thickness of the intermediate layer of the red sub-pixel R is substantially equal to the sum of the thickness of the intermediate layer in the green sub-pixel G and the thickness of the intermediate layer in the blue sub-pixel B.

Figure 1B:
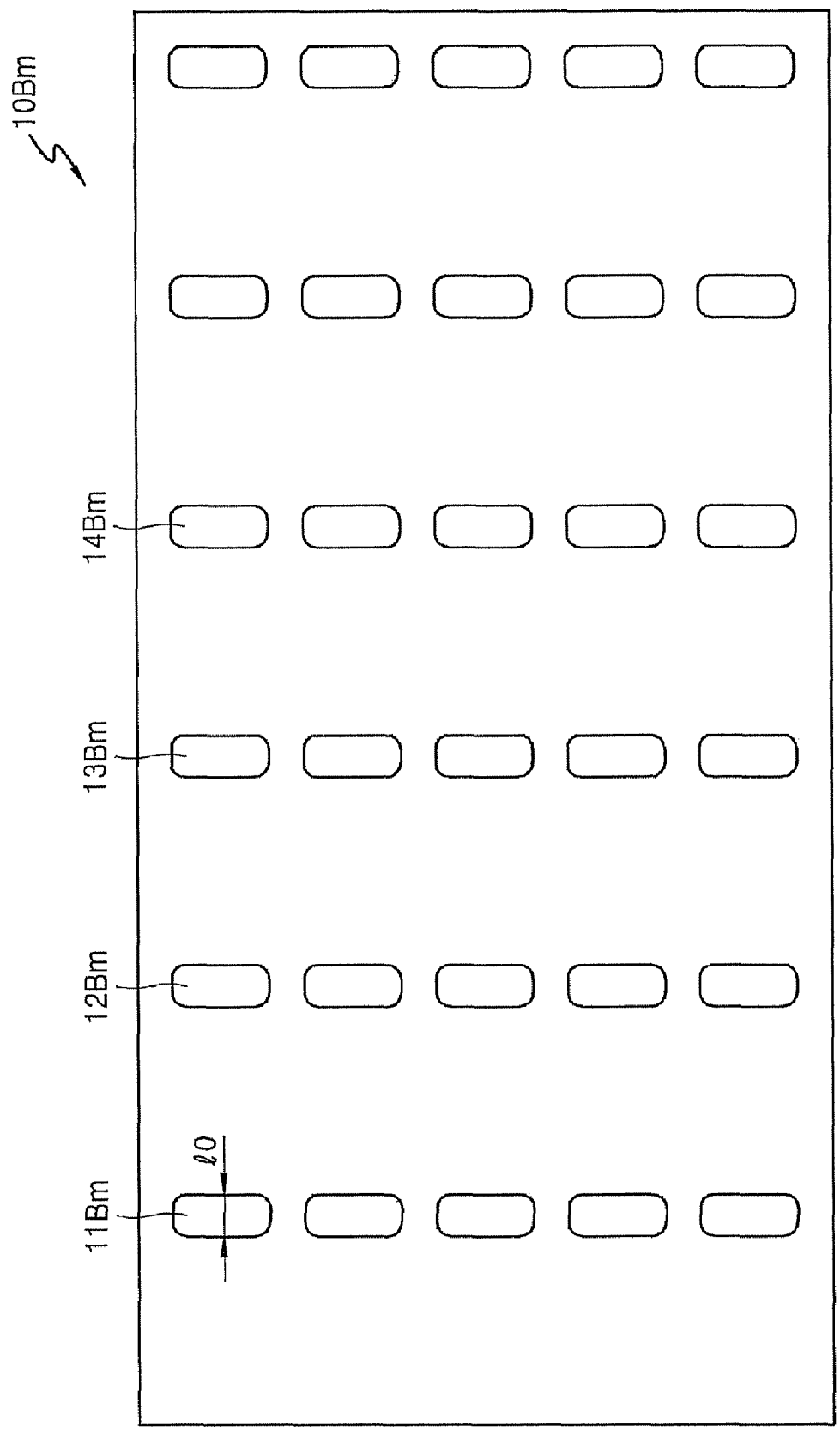
FIG. 1B is a plan view schematically illustrating a conventional mask for depositing a blue emission layer of the organic light-emitting display device of FIG. 1A.
Figure 4:
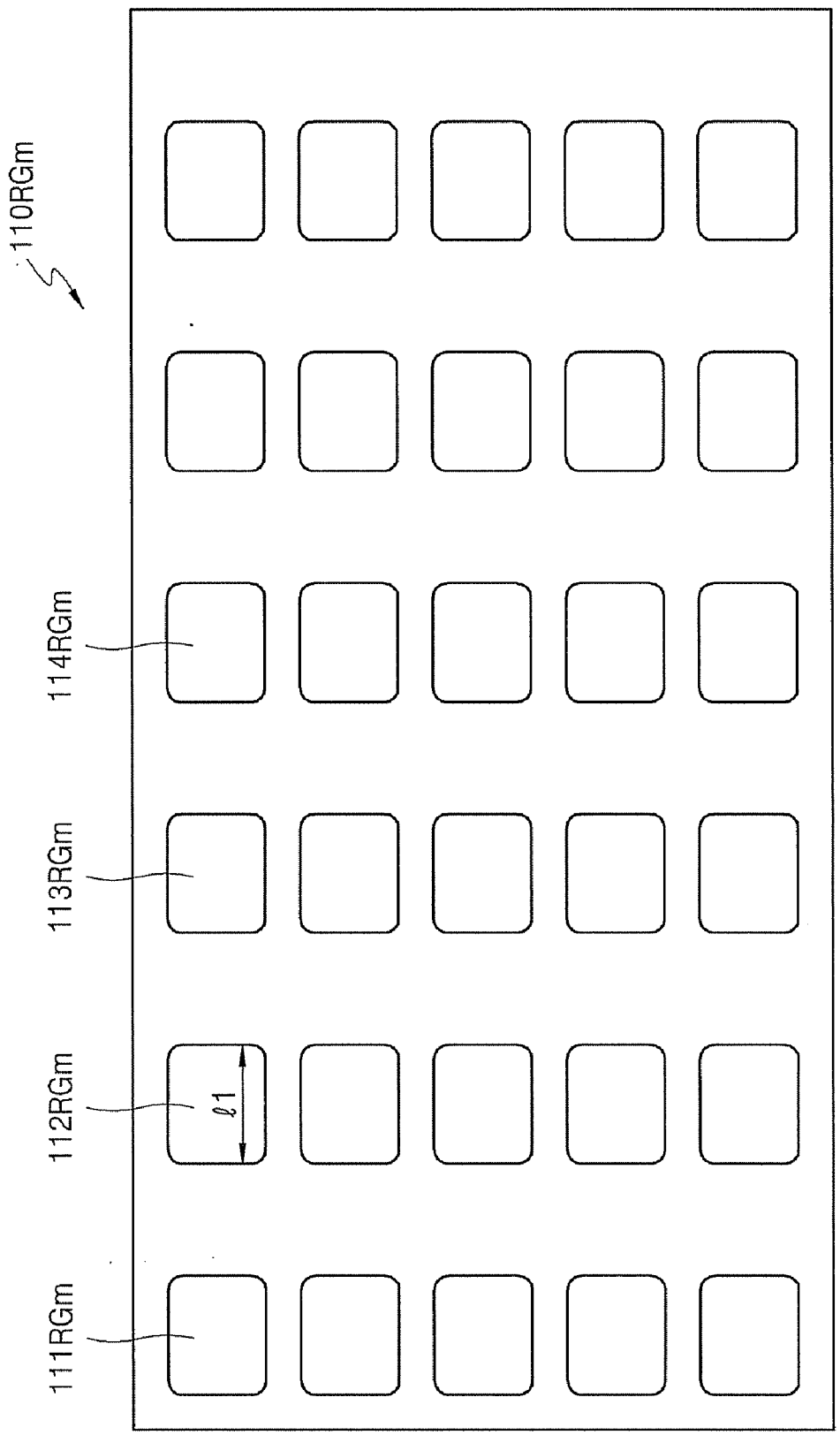
FIGS. 4 and 5 are plan views schematically illustrating masks for depositing intermediate layers of an organic light-emitting display device.
Figure 5:
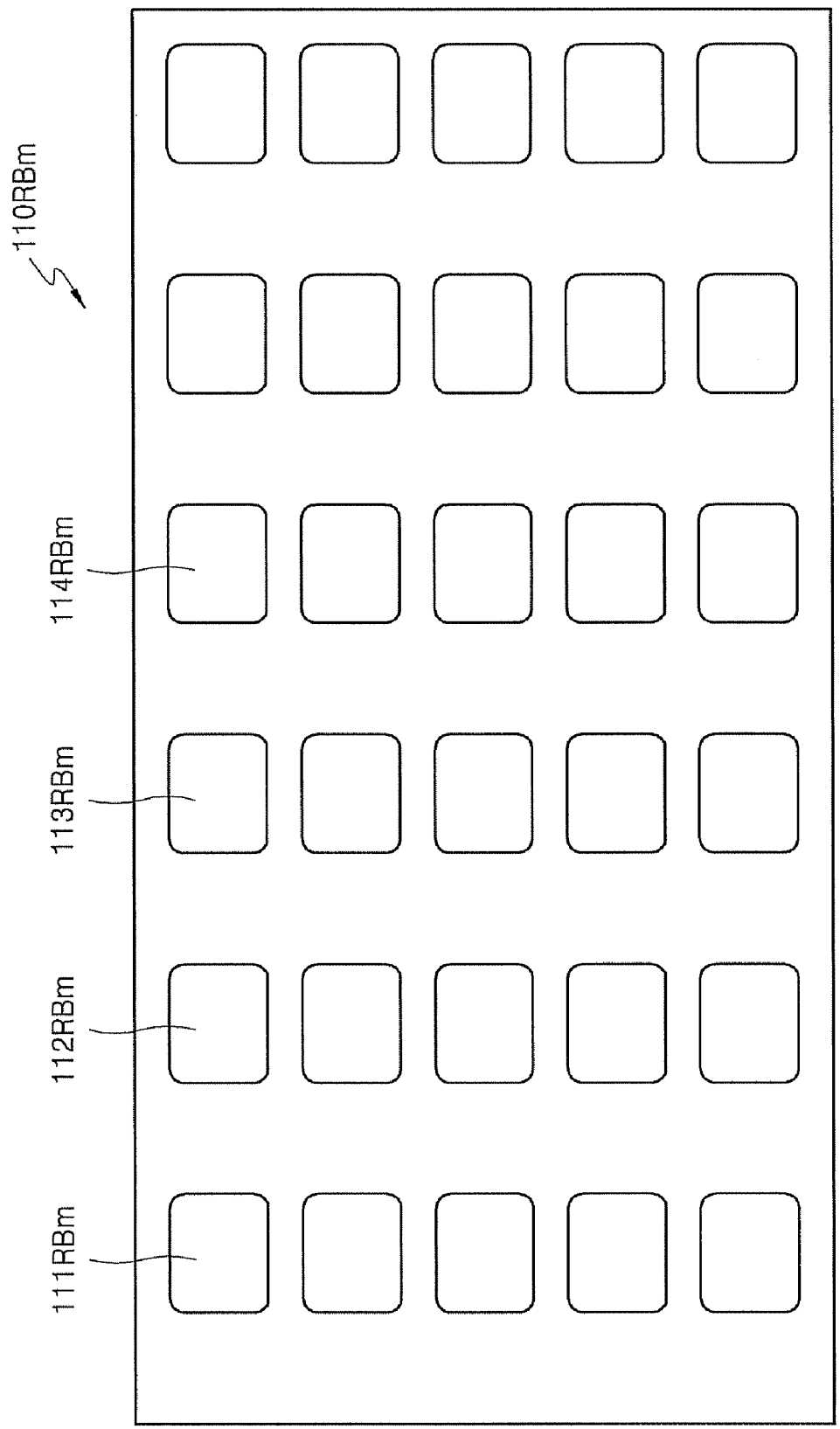

In the method of manufacturing the organic light-emitting display device according to the first exemplary embodiment, masks 110RGm and 110RBm, as illustrated in FIGS. 4 and 5, are used. When the masks 110RGm and 110RBm are used, the width l1, of each of a plurality of openings 111RGm and 112RGm in the mask 110RGm and a plurality of openings 111RBm and 112RBm in the mask 110RBm are approximately double the width l0 of each of the openings 11Bm and 12Bm of the conventional mask 10Bm, illustrated in FIG. 1B. Accordingly, it is possible to lessen the difficulties in the manufacturing process of a mask and the alignment process of a mask, thereby, increasing the yield and reducing costs in manufacturing a high-quality and high-definition display device.

Figure 3E:
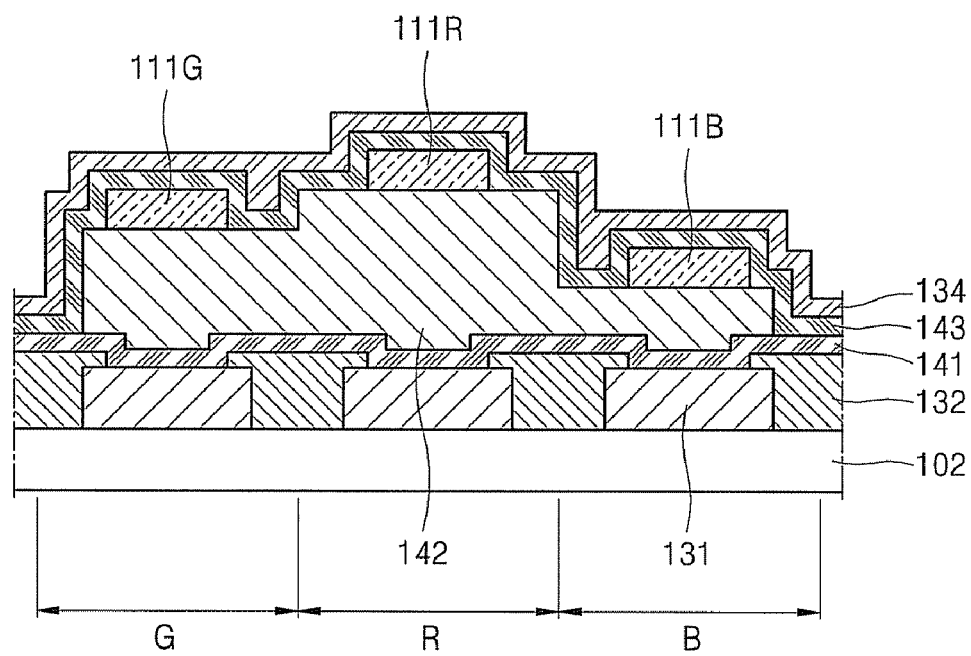

As illustrated in FIG. 3E, the emission layers 111R, 111G, and 111B are formed on the HTL 142. A material of the emission layers 111R, 111G, and 111B is not particularly limited. Then, the ETL 143 is formed by vacuum-depositing or spin-coating an electron transport material on the emission layers 111R, 111G, and 111B. The electron transport material is not particularly limited and may be Alq3. Then, the second electrodes 134 are formed by depositing a material for a second electrode on the ETL 143. The material for a second electrode may be a conductive, transparent metal oxide selected from the group consisting of indium tin oxide (ITO), indium zinc oxide (IZO), tin oxide ($SnO_2$), and a zinc oxide (ZnO). Otherwise, the ETL 143 may be formed as a reflective electrode, a semi-transparent electrode, or a transparent electrode by depositing a thin film using a metallic material selected from the group consisting of lithium (Li), magnesium (Mg), aluminum (Al), an aluminum-lithium alloy (Al—Li), calcium (Ca), a magnesium-indium alloy (Mg—In), a magnesium-silver alloy (Mg—Ag), and a calcium-aluminum alloy (Ca—Al). However, the material for a second electrode is not limited to the described materials. The first electrodes 131 and the second electrodes 134 may respectively function as an anode and a cathode, and vice versa.

As described above, according to an exemplary embodiment of the present invention, a fine-pitch mask for forming intermediate layers can be easily manufactured since the sizes of openings of the mask may be relatively large. Thus, a high-definition display device can be manufactured using the mask.

Figure 6:
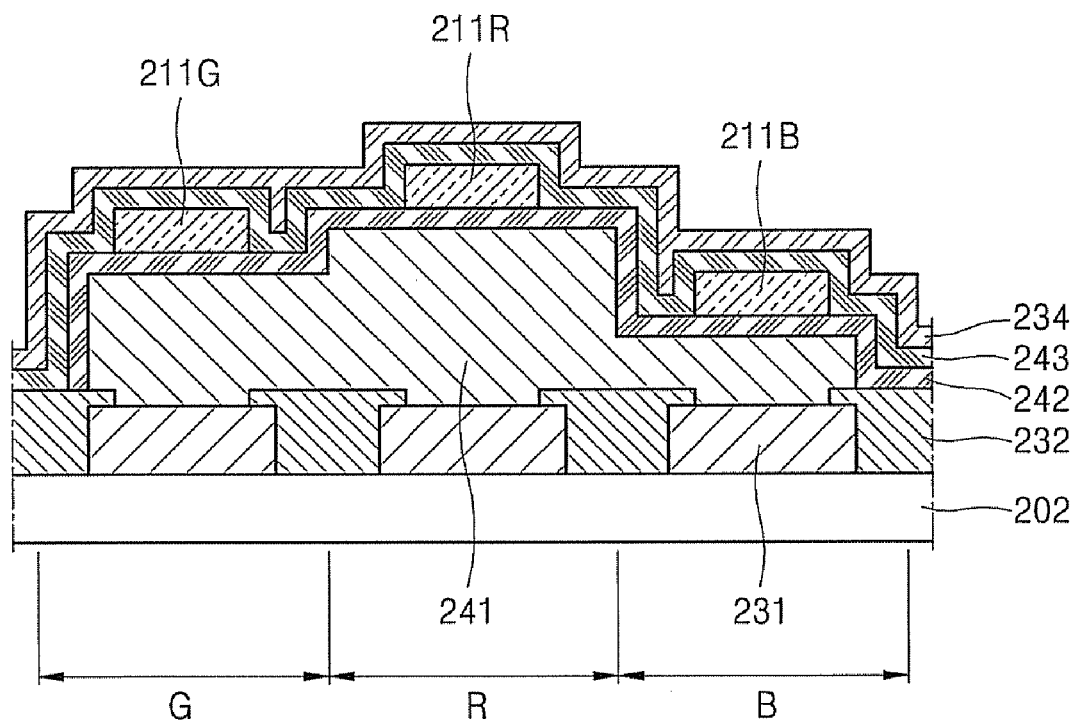
FIG. 6 is a cross-sectional view of an organic light-emitting display device according to a second exemplary embodiment of the present invention.

FIG. 6 is a cross-sectional view of an organic light-emitting display device according to a second exemplary embodiment of the present invention. FIGS. 7A through 7E are cross-sectional views schematically and sequentially illustrating a method of manufacturing the organic light-emitting display device.

Referring to FIGS. 6 and 7, the organic light-emitting display device includes a substrate 202, a plurality of first electrodes 231, an insulating layer 232, a plurality of second electrodes 234, a plurality of emission layers: 211R (red emission layer), 211G (green emission layer), and 211B (blue emission layer), and an intermediate layer formed on the top and/or bottom of the emission layers (211R, 211G, and 211B). The intermediate layer includes a hole injection layer 241, a hole transport layer 242, and an electron transport layer 243. The emission layers: 211R, 211G, and 211B, the hole injection layer 241, the hole transport layer 242, and electron transport layer 243 are formed between the first electrodes 231 and the second electrodes 234. The emission layers (211R, 211G, and 211B) may respectively emit red, green, or blue light depending on a material thereof.

Figure 7A:
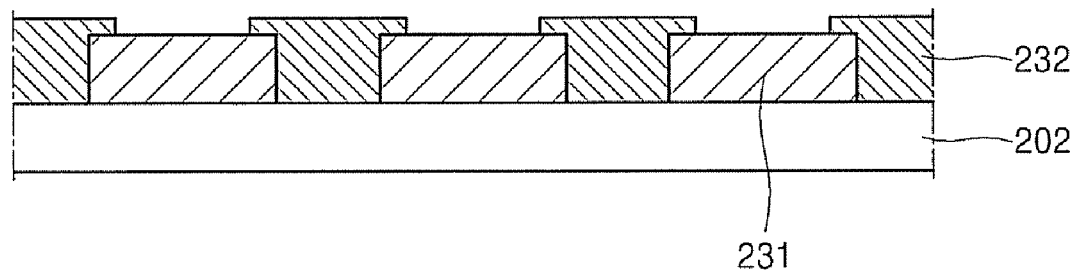
FIGS. 7A through 7E are cross-sectional views sequentially illustrating a method of manufacturing the organic light-emitting display device according to the second exemplary embodiment of the present invention.

The second exemplary embodiment differs from the first exemplary embodiment in that the hole injection layer 241 is formed to different thicknesses for different sub-pixels. In detail, the hole injection layer 241 is formed, as one piece, in a red sub-pixel R and a green sub-pixel G, and is formed again, as one piece, in the red sub-pixel R and a blue sub-pixel B. That is, the hole injection layer 241 is deposited only once in the green sub-pixel G and the blue sub-pixel B, but is deposited twice in the red sub-pixel R. Thus, the thickness of the hole injection layer 241 in the red sub-pixel R is greater than in the green and blue sub-pixels G and B. In other words, the thickness of the hole injection layer 241 in the red sub-pixel R is substantially equal to the sum of the thickness of the hole injection layer 241 in the green sub-pixel G and the thickness of the hole injection layer 241 in the blue sub-pixel B. The hole injection layer 241 may be formed as one piece within one pixel. To this end, as illustrated in FIG. 7A, the first electrodes 231 and an insulating layer 232 are formed on the substrate 202.

Figure 7B:
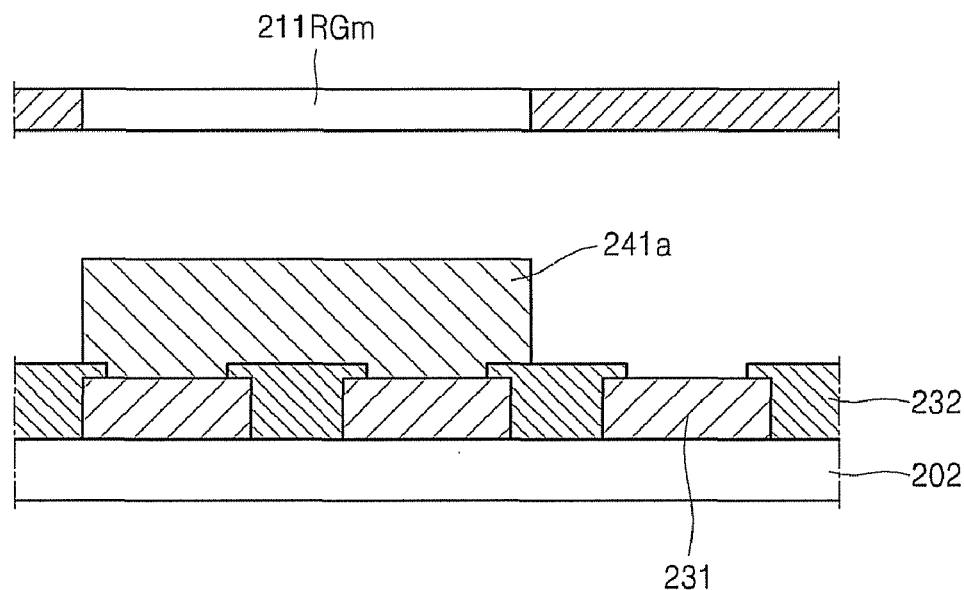
Figure 7C:
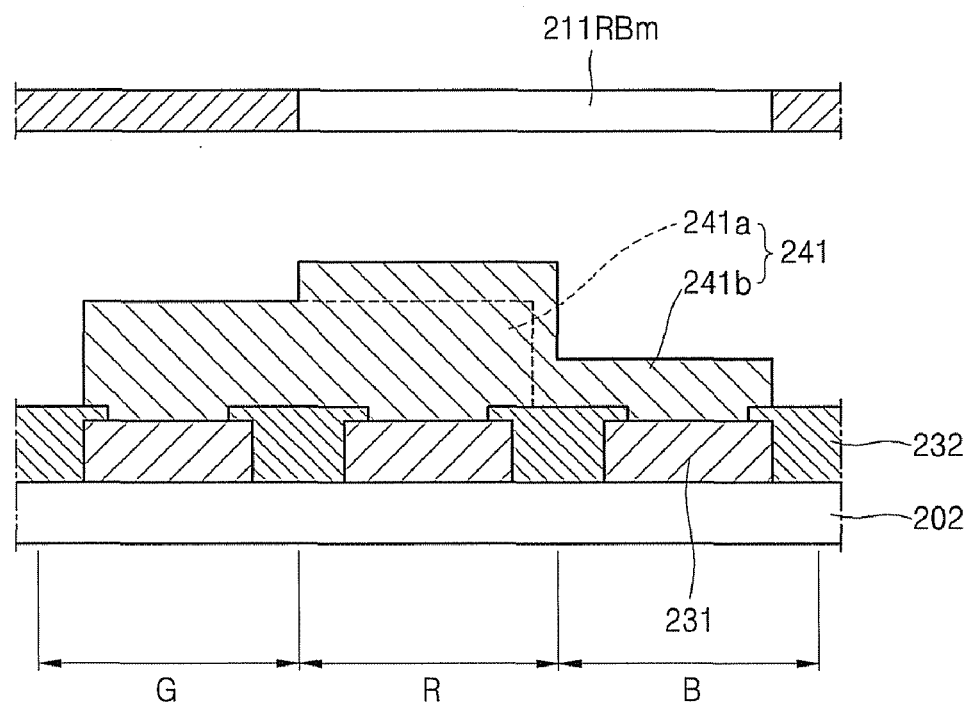

Then, as illustrated in FIG. 7B, a hole injection layer 241a is formed, as one piece, on the first electrodes 231 and the insulating layer 232 in both the red sub-pixel R and the green sub-pixel G. Then, as illustrated in FIG. 7C, a hole injection layer 241b is formed, as one piece, on the first electrodes 231 and the insulating layer 232 in both the red sub-pixel R, and the blue sub-pixel B.

Figure 7D:
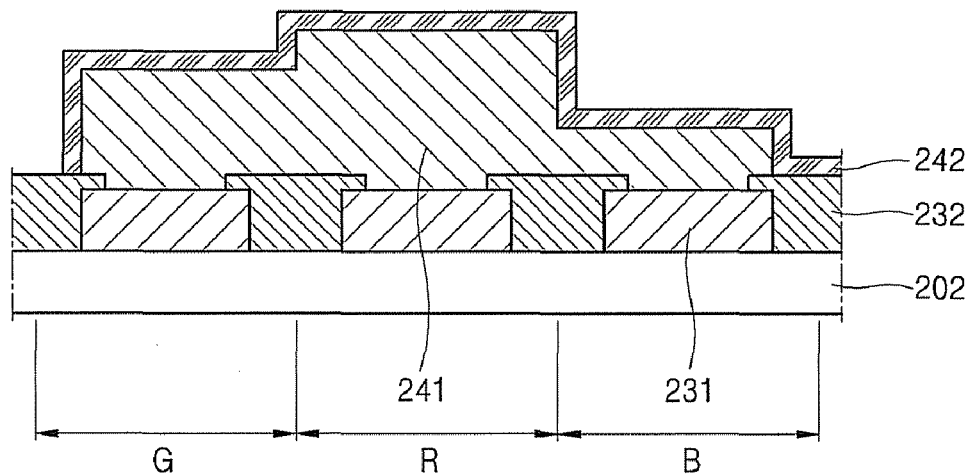
Figure 7E:
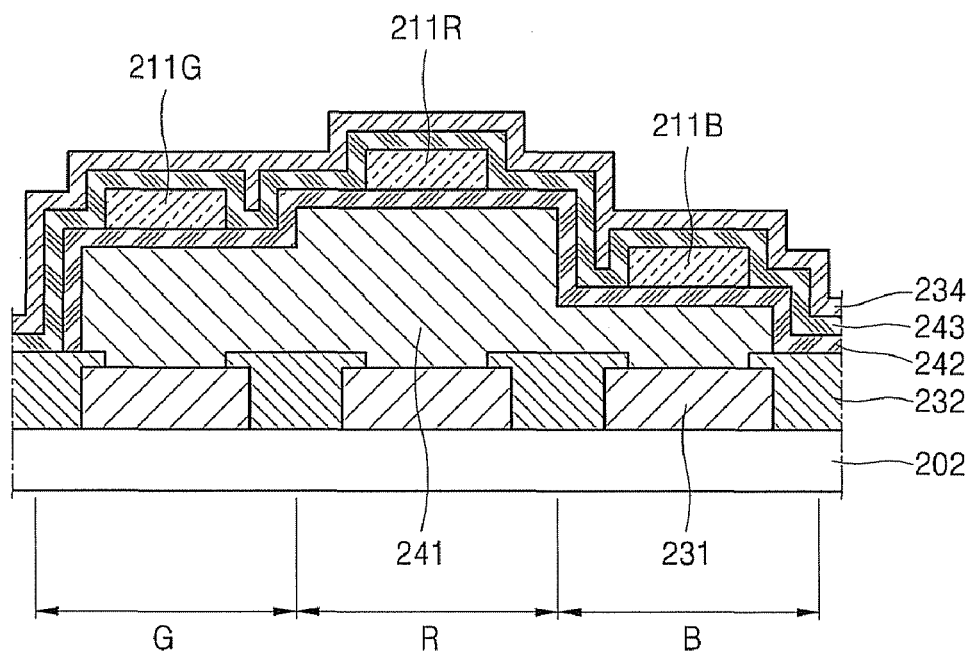

As illustrated in FIG. 7D, the hole transport layer 242 is formed on the hole injection layer 241. Lastly, as illustrated in FIG. 7E, the emission layers: 211R, 211G, and 211B, the electron transport layer 243, and the second electrodes 234 are sequentially formed on the hole transport layer 242. As described above, a fine-pitch mask for forming intermediate layers can be easily made since the sizes of openings can be relatively large. A high-definition display device can be manufactured using the mask.

Figure 8:
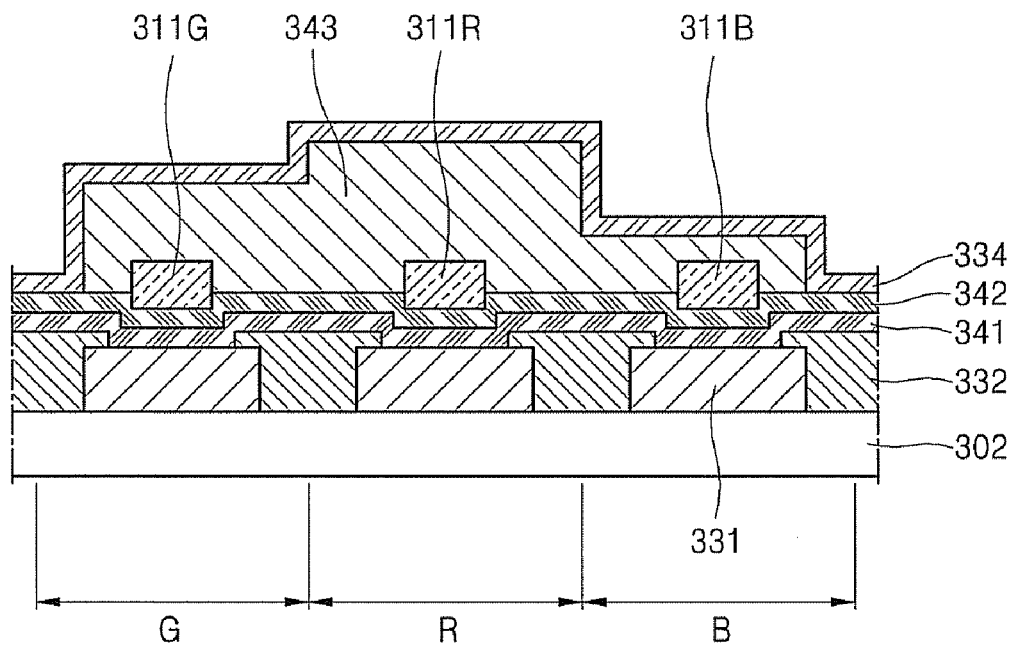
FIG. 8 is a cross-sectional view of an organic light-emitting display device according to a third exemplary embodiment of the present invention.

In the first exemplary embodiment, a hole injection layer is formed to a predetermined thickness for one pixel, and a hole transport layer is formed on the hole injection layer. The thickness of the hole transport layer can vary at different sub-pixels. In the second exemplary embodiment, a hole injection layer is formed to different thicknesses in different sub-pixels, and a hole transport layer is formed on the hole injection layer. However, the present invention is not limited thereto. That is, it is possible to derive from the first and second exemplary embodiments an organic light-emitting display device, including a hole injection layer formed to different thicknesses, and a hole transport layer that is formed on the hole injection layer, such that the thickness of the hole transport layer varies in different sub-pixels. FIG. 8 is a cross-sectional view of an organic light-emitting display device according to a third exemplary embodiment of the present invention. FIGS. 9A through 9E are cross-sectional views sequentially illustrating a method of manufacturing the organic light-emitting display device.

Referring to FIGS. 8 and 9A through 9E, the organic light-emitting display device includes a substrate 302, a plurality of first electrodes 331, an insulating layer 332, a plurality of second electrodes 334, a plurality of emission layers 311R, 311G, and 311B, and an intermediate layer. The intermediate layer can comprise a hole injection layer 341, a hole transport layer 342, and an electron transport layer 343. The emission layers 311R, 311G, and 311B can be formed within the intermediate layer. The emission layers: 311R, 311G, and 311B, the hole injection layer 341, hole transport layer 342, and electron transport layer 343 are formed between the first electrodes 331 and the second electrodes 334. The emission layers: 311R, 311G, and 311B can respectively emit red, green, or blue light, depending on a material thereof.

The third exemplary embodiment is differentiated from the first and second embodiments in that the electron transport layer 343 is formed to different thicknesses for different sub-pixels. In detail, the electron transport layer 343 is deposited, as one piece, in both a red sub-pixel R and a green sub-pixel G, and then, is deposited, as one piece, in both the red sub-pixel R and a blue sub-pixel B. That is, the electron transport layer 343 is deposited only once in the green and blue sub-pixels G and B, but is deposited twice in the red sub-pixel R. Thus, the thickness of the electron transport layer 343 in the red sub-pixel R is greater than in the green and blue sub-pixels G and B. In other words, the thickness of the electron transport layer 343 in the red sub-pixel R is substantially equal to the sum of the thickness of the electron transport layer 343 in the green sub-pixel G and the thickness of the electron transport layer 343 in the blue sub-pixel B. Alternatively, The electron transport layer 343 may be formed as one piece within one pixel.

Figure 9A:
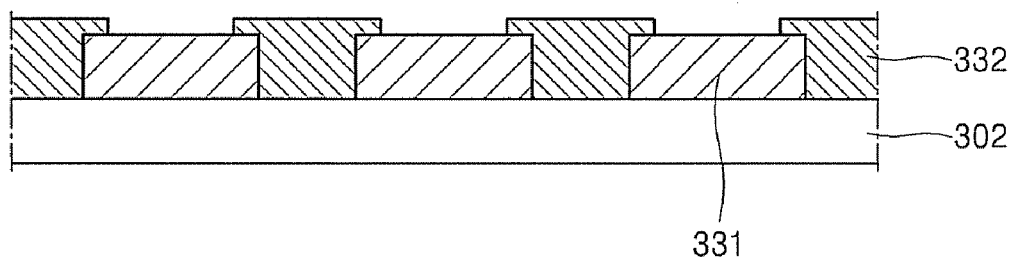
FIGS. 9A through 9E are cross-sectional views sequentially illustrating a method of manufacturing the organic light-emitting display device according to the third exemplary embodiment of the present invention.
Figure 9B:
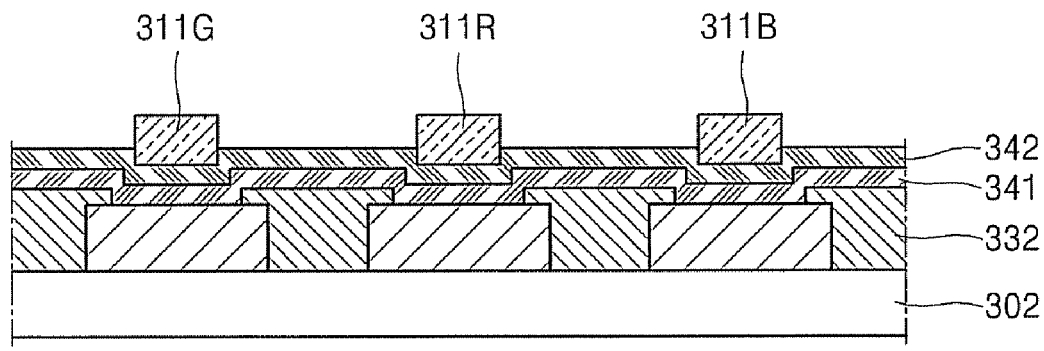
Figure 9C:
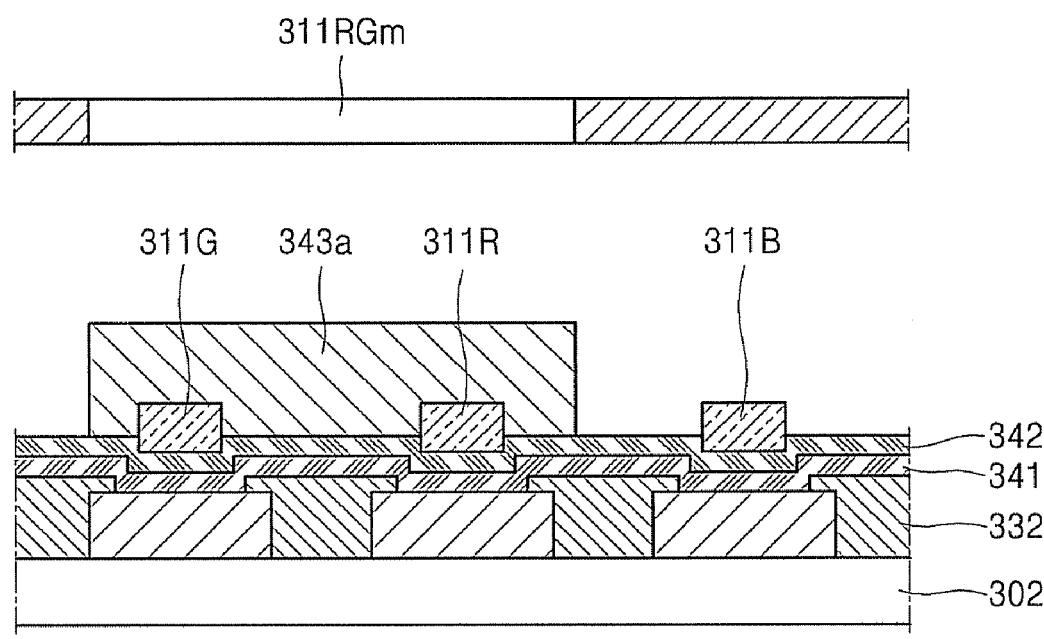

As illustrated in FIG. 9A, the first electrodes 331 and the insulating layer 332 are formed on the substrate 302. Then, as illustrated in FIG. 9B, the hole injection layer 341 and the hole transport layer 342 are formed on the first electrodes 331 and the insulating layer 332. The emission layers 311R, 311G, and 311B are formed on the hole transport layer 342. Then, as illustrated in FIG. 9C, an electron transport layer 343a is formed, as one piece, in the red sub-pixel R and the green sub-pixel G.

Figure 9D:
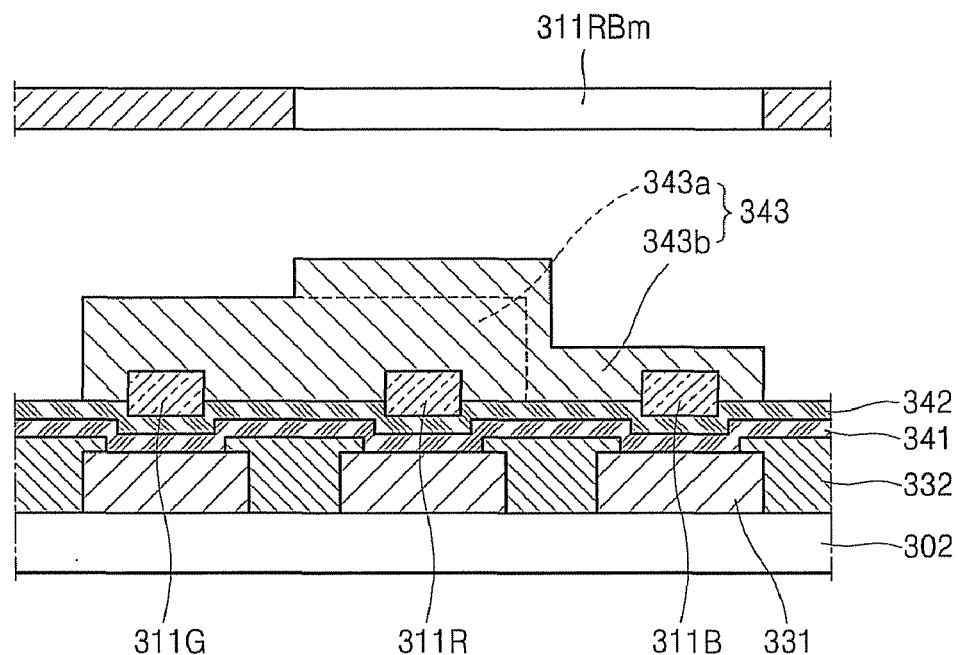
Figure 9E:
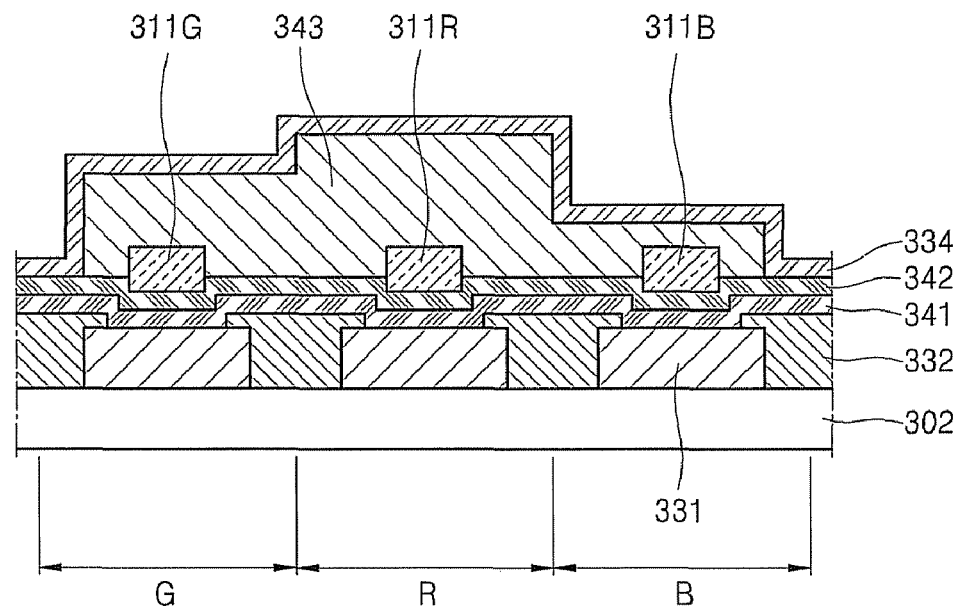

As illustrated in FIG. 9D, an electron transport layer 343b is formed, as one piece, in the red sub-pixel R and the blue sub-pixel B. Then, as illustrated in FIG. 9E, the second electrodes 334 are formed on the electron transport layer 343.

As described above, according to an exemplary embodiment of the present invention, a fine-pitch mask for forming intermediate layers can be easily made since the sizes of openings can be relatively large. A high-definition display device can be manufactured using the mask.

Figure 10A:
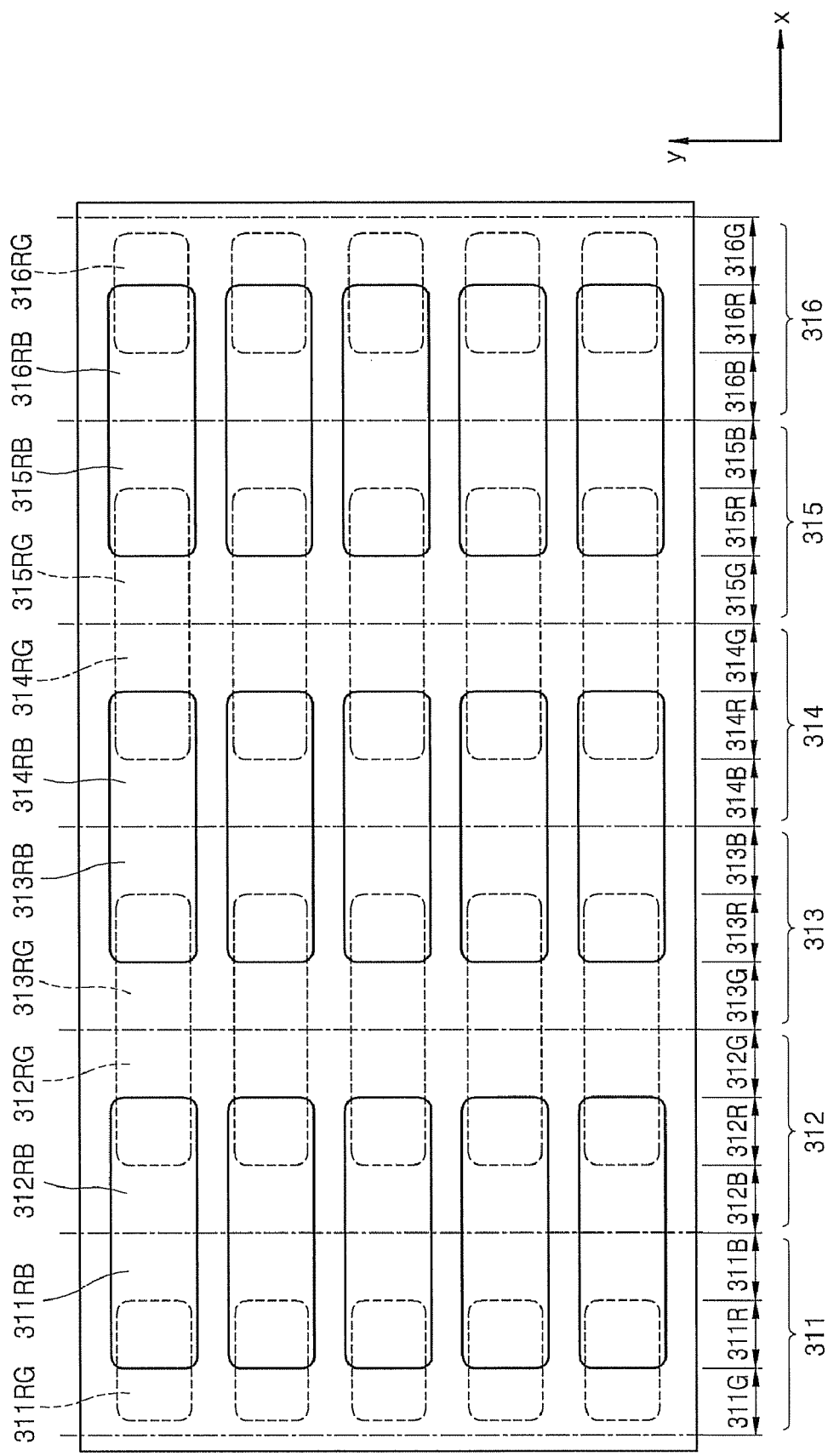
FIG. 10A is a plan view schematically illustrating an intermediate layer pattern of an organic light-emitting display device according to a fourth exemplary embodiment of the present invention.

FIG. 10A is a plan view of an intermediate layer pattern of an organic light-emitting display device according to a fourth exemplary embodiment of the present invention. FIG. 10B is a plan view schematically illustrating a mask for depositing red-green intermediate layers of the organic light-emitting display device of FIG. 10A. FIG. 100 is a plan view schematically illustrating a mask for depositing red-blue intermediate layers of the organic light-emitting display device of FIG. 10A. As described above, FIG. 10A schematically illustrates the intermediate layer pattern of the organic light-emitting display device, but may be considered to represent a plurality of sub-pixels, for convenience of explanation.

The organic light-emitting display device includes a plurality of pixels, each including red, green, and blue sub-pixels sequentially arranged in one direction, e.g., in the x-axis direction, as indicated in FIG. 10A. The sub-pixels are arranged such that the colors of the light emitted from the respective sub-pixels of a first pixel are symmetrical with the colors emitted from corresponding sub-pixels of a second pixel facing the first pixel in the x-axis direction, about the boundary between the first and second pixels. That is, for example, the sub-pixels of the pixels in the x-axis direction are arranged in the order of green, red, blue, blue, red, green, green, red, blue, blue, red, green, etc.

The organic light-emitting display device according to the fourth exemplary embodiment is different from the first and second exemplary embodiments in terms of an intermediate layer shape. Each of the sub-pixels includes a first electrode and a second electrode that face each other and an intermediate layer interposed between the first and second electrodes. In the organic light-emitting display device according to the fourth exemplary embodiment, an intermediate layer is formed as one piece across two sub-pixels that are adjacent in the x-axis direction. More specifically, in the intermediate layer pattern (sub-pixel pattern) illustrated in FIG. 10A, if the plurality of pixels in the uppermost row are a first pixel 311, a second pixel 312, a third pixel 313, and a fourth pixel 314 in the x-axis direction, the first pixel 311 includes a sub-pixel 311G (green sub-pixel), a sub-pixel 311R (red sub-pixel), and a sub-pixel 311B (blue sub-pixel).

A plurality of sub-pixels 312B, 312R, and 312G of the second pixel 312, which is adjacent to the first pixel 311, are arranged to be symmetrical with respect to the sub-pixels 311G, 311R, and 311B of the first pixel 311 along the boundary between the first and second pixels 311 and 312. Thus, the second pixel 312 includes the sub-pixel 312B, the sub-pixel 312R, and the sub-pixel 312G.

In the above intermediate layer pattern, an intermediate layer is formed as one piece in sub-pixels adjacent at the boundary between the first and second pixels 311 and 312. That is, an intermediate layer 311RB is formed as one piece across red and blue sub-pixels 311R and 311B of the first pixel 311. An intermediate layer 312RB is formed as one piece across red and blue sub-pixels 312R and 312B of the second pixel 312. Similarly, an intermediate layer is formed as one piece across sub-pixels adjacent to the boundary between the second pixel 312 and the third pixel 313. That is, an intermediate layer 312RG is formed as one piece for red and green sub-pixels. An intermediate layer 313RG is formed as one piece across red and green sub-pixels in the third pixel 313. Similarly, the other pixels in the x-axis direction also have the above-described pattern.

In this case, a mask 310RGm, illustrated in FIG. 10B, is used to form an intermediate layer for red and green sub-pixels. A mask 310RBm, illustrated in FIG. 10C, is used to form an intermediate layer for red and blue sub-pixels. Referring to FIGS. 10B and 10C, the sizes of openings in the masks 310RGm and 310RBm are relatively large.

The mask 310RGm, illustrated in FIG. 10B, is used to deposit an intermediate layer according to the arrangement of sub-pixels in the organic light-emitting display device. The area of each of the openings in the mask 310RGm is approximately four times larger than the openings in the conventional mask 10Bm, illustrated in FIG. 1B. Accordingly, a high-definition organic light-emitting display device can be realized.

The construction of a light-emitting device having the above intermediate layers, which can be included in the organic light-emitting display devices according to the above embodiments, will now be briefly described with reference to FIGS. 11 and 12. A light-emitting device that can be included in the organic light-emitting display devices is formed on a substrate 602. The substrate 602 is manufactured using a transparent glass material, but may be manufactured using various plastic materials, such as acryl, polyimide, polycarbonate, polyester, and MYLAR.

The light-emitting device may have various shapes. For example, the light-emitting device may be a passive matrix (PM) light-emitting device, or may be an active matrix (AM) light-emitting device that has a thin transistor.

Figure 11:
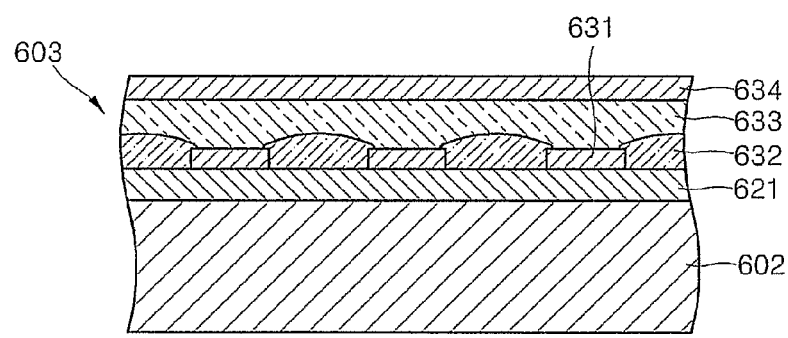
FIG. 11 is a cross-sectional view of a passive matrix (PM) light-emitting device according to an exemplary embodiment of the present invention.

FIG. 11 is a cross-sectional view of a PM light-emitting device 603 according to an exemplary embodiment of the present invention. Referring to FIG. 11, a buffer layer 621 ($SiO_2$ layer) is formed on the substrate 602. A plurality of first electrodes 631 are formed in a predetermined pattern on the buffer layer 621. Then, an emission layer 633 and a plurality of second electrodes 634 are sequentially formed on the first electrodes 631. An insulating layer 632 may be interposed between lines of the first electrodes 631. The second electrodes 634 may be formed in a pattern orthogonal to the pattern of the first electrodes 631. Although not shown in the drawings, an additional insulating layer may further be included as a pattern orthogonal to the first electrodes 631 in order to obtain the pattern of the second electrodes 634.

The emission layer 633 may be formed of an organic material or an inorganic material. When the emission layer 633 is formed of an organic material, a small molecule organic material or a polymer organic material may be used. If a small molecule organic material is used, a hole injection layer (HIL), a hole transport layer (HTL), an organic emission layer (EML), an electron transport layer (ETL), and an electron injection layer (EIL) may be stacked in a single or composite structure. Various organic materials, such as copper phthalocyanine (CuPc), N,N'-Di(naphthalene-1-yl)-N,N'-diphenyl-benzidine (NPB), and tris-8-hydroxyquinoline aluminum (Alq3), can be used. The emission layer 633 is obtained by patterning one of the above small molecule organic materials, and vacuum-depositing the resultant structure using one of the above masks.

In general, if the emission layer 633 is formed of a polymer organic material, it includes the hole transport layer and the emission layer. In this case, the hole transport layer is formed of Poly(3,4-ethylenedioxythiophene) poly(styrenesulfonate) (PEDOT), and the emission layer is formed of a Poly-Phenylenevinylene (PPV)/Polyfluorene-based polymer organic material.

The first electrodes 631 can be anode electrodes and the second electrodes 634 can be cathode electrodes, and vice versa. The first electrodes 631 may be transparent electrodes or reflective electrodes. If the first electrodes 631 are transparent electrodes, ITO, IZO, ZnO, or $In_2O_3$ may be used. If the first electrodes 631 are reflective electrodes, first electrodes 631 are obtained by forming a reflective layer by using Ag, Mg, Al, Pt, Pd, Au, Ni, Nd, Ir, Cr, or a compound thereof and then depositing a layer made of ITO, IZO, ZnO, or $In_2O_3$ on the resultant structure.

The second electrodes 634 may also be transparent electrodes or reflective electrodes. If the second electrodes 634 are transparent electrodes, the second electrodes 634 can be used as cathode electrodes. Thus, the second electrodes 634 may be obtained by depositing a metal material having a small work function, such as Li, Ca, LiF/Ca, LiF/Al, Al, Mg, or a compound thereof on the emission layer 633, which is an organic layer. Auxiliary electrodes or butt electrode lines can be then formed by using a material such as ITO, IZO, ZnO, or $In_2O_3$. If the second electrodes 634 are reflective electrodes, they can be formed by depositing Li, Ca, LiF/Ca, LiF/Al, Al, Mg, or a compound thereof.

Figure 12:
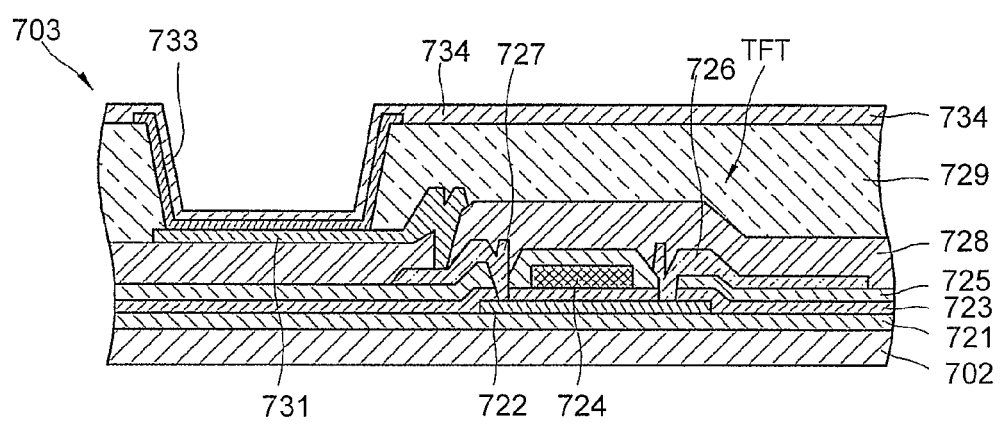
FIG. 12 is a cross-sectional view of an active matrix (AM) light-emitting device according to an exemplary embodiment of the present invention.

FIG. 12 is a cross-sectional view of an AM light-emitting device 703 according to an exemplary embodiment of the present invention. In the AM light-emitting device 703, each sub-pixel includes at least one thin film transistor (TFT), as illustrated in FIG. 12. The construction of the TFT is not limited to the one illustrated in FIG. 12, and a total number and construction of thin transistors TFT can vary.

As illustrated in FIG. 12, a buffer layer 721 made of $SiO_2$ is formed on a glass substrate 702, and the TFT is formed on the buffer layer 721. The TFT includes an active layer 722 on the buffer layer 721, a gate insulating layer 723 on the active layer 722 and the buffer layer 721, and a gate electrode 724 on the gate insulating layer 723. The gate electrode 724 is formed at a predetermined location on the gate insulating layer 723, and is connected to a gate line that transfers an on/off signal of the TFT. The predetermined location on which the gate electrode 724 is formed corresponds to a channel region in the active layer 722.

An inter-insulator 725 is formed on the gate electrode 724. A source electrode 726 and a drain electrode 727 are formed to respectively contact a source region and a drain region of the active layer 722 via a contact hole.

A passivation layer 728 made of $SiO_2$ is formed on the source electrode 726 and the drain electrode 727. A pixel defining layer 729 made of acryl or polyimide is formed on the passivation layer 728, can protect the TFT, and can planarize an upper surface of the TFT.

Although not shown in the drawings, at least one capacitor is connected to the TFT. A circuit having such the TFT is not limited to the one illustrated in FIG. 12.

The AM light-emitting device 703 is connected to the drain electrode 727 of the TFT. A first electrode 731 of the AM light-emitting device is formed on the passivation layer 728, and the pixel defining layer 729 is formed on the first electrode 731. An emission layer 733 is formed in an opening of the pixel defining layer 729.

FIG. 12 illustrates that the emission layer 733 is patterned to correspond to only one sub-pixel (in order to explain the construction of each of the sub-pixels) for convenience, but the emission layer 733 may extend to an adjacent sub-pixel.

Materials of the first electrode 731a second electrode 734, the emission layer 733, and intermediate layers (not shown) formed on the top and bottom of the emission layer 733 may be the same as in the PM light-emitting device 603. The AM light-emitting device 603 is sealed on the substrate 702 and an opposite unit (not shown). The opposite unit may include a glass or plastic material, or may be formed as a metal cap.

In a light-emitting display device having such light-emitting devices, intermediate layers are constructed as described above, and thus, pattern precision can be improved while easily depositing an intermediate layer in each sub-pixel, thereby increasing the resolution of the light-emitting display device.

The above exemplary embodiments of the present invention have been described with respect to a light-emitting display device, but aspects of the present invention can also be applied to any type of a display device in which each sub-pixel is formed through deposition. A display device according to the above embodiments of the present invention has the following advantages.

First, it is possible to lessen difficulties in manufacturing and alignment processes of a mask. Thus, it is possible to prevent the yield from decreasing due to a reduction in the distances between sub-pixels. It is also possible to reduce manufacturing costs when manufacturing a high-quality and high definition display device. Second, it is possible to increases the sizes of openings in a mask for forming intermediate layers. Third, it is possible to easily make a fine-pitch mask, and manufacture a high-definition display device by using the mask.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting display device comprising:
pixels to emit light in a first direction, comprising a first electrode, a second electrode, and an intermediate layer disposed between the first and second electrodes, wherein,
each pixel is divided into red, green, and blue sub-pixels, the red, green, and blue sub-pixels respectively comprising red, green, and blue emission layers disposed in the intermediate layer, the red, green, and blue emission layers being spaced apart from each other,
the thickness of the intermediate layer varies according to the sub-pixels, and
in each of the pixels, the red sub-pixel is disposed between the green and blue sub-pixels.

2. The device of claim 1, wherein:
the thickness of the intermediate layer is at a maximum in the red sub-pixel.

3. The device of claim 2, wherein the sum of the thickness of the intermediate layer in the blue sub-pixel and the thickness of the intermediate layer in the green sub-pixel is substantially equal to the thickness of the intermediate layer in the red sub-pixel.

4. The device of claim 1, wherein the thickness of the intermediate layer is at a maximum in the red sub-pixels.

5. The device of claim 1, wherein the sub-pixels of adjacent pixels are symmetrically disposed according to color about a boundary between the adjacent pixels.

6. The device of claim 1, wherein the intermediate layer comprises:
   a hole injection layer disposed on the first electrode, the hole injection layer having a generally constant thickness; and
   a hole transport layer disposed on the hole injection layer, the hole injection layer having a thickness that varies according to the sub-pixels.

7. The device of claim 1, wherein the intermediate layer comprises:
   a hole injection layer disposed on the first electrode in each pixel, the hole injection layer having a thickness that varies according to the sub-pixels; and
   a hole transport layer disposed on the hole injection layer, the hole transport layer having a generally constant thickness.

8. The device of claim 1, wherein the intermediate layer comprises:
   a hole injection layer having a thickness that varies according to the sub-pixels; and
   a hole transport layer formed on the hole injection layer, the hole transport layer having a thickness that varies according to the sub-pixels.

9. The device of claim 1, wherein the intermediate layer comprises an electron transport layer having a thickness that varies according to the sub-pixels.

10. The device of claim 1, wherein the green or blue sub-pixels of adjacent pixels are disposed at a boundary between the adjacent pixels.

11. The device of claim 1, wherein the thickness of the intermediate layer increases from the blue sub-pixel, to the green sub-pixel, to the red sub-pixel.

12. An organic light-emitting display device comprising:
   pixels to emit light in a first direction, comprising a first electrode, a second electrode, and an intermediate layer disposed between the first and second electrodes, wherein,
      each pixel is divided into red, green, and blue sub-pixels, the red, green, and blue sub-pixels respectively comprising red, green, and blue emission layers disposed in the intermediate layer, the red, green, and blue emission layers being spaced apart from each other,
      the thickness of the intermediate layer varies according to the sub-pixels, and
   in each of the pixels the intermediate layer is formed as one piece.

13. An organic light-emitting display device comprising:
   pixels to emit light in a first direction, comprising a first electrode, a second electrode, and an intermediate layer disposed between the first and second electrodes, wherein,
      each pixel is divided into red, green, and blue sub-pixels, the red, green, and blue sub-pixels respectively comprising red, green, and blue emission layers disposed in the intermediate layer, the red, green, and blue emission layers being spaced apart from each other,
      the thickness of the intermediate layer varies according to the sub-pixels,
      the sub-pixels of adjacent pixels are symmetrically disposed according to color about a boundary between the adjacent pixels, and
      the intermediate layer is formed as one or more pieces that each extend across the boundary so as to be disposed in at least two of the adjacent pixels.

14. A method of manufacturing an organic light-emitting display device having a plurality of pixels that are each divided into red, green, and blue sub-pixels, the method comprising:
   forming first electrodes on a surface of a substrate;
   forming emission layers and an intermediate layer on the first electrodes, wherein the forming of the emission layers and the forming of the intermediate layer comprises varying a thickness of the intermediate layer according to the sub-pixels as to cause resonance between the first electrodes and a second electrode when light is emitted; and
   forming the second electrode on the intermediate layer, wherein
   the forming of the intermediate layer further comprises:
      forming first portions of the intermediate layer across adjacent red and green sub-pixels in each of the pixels; and
      forming second portions of the intermediate layer across adjacent red and blue sub-pixels in each of the pixels, such that the respective first and second portions are joined together.

15. The method of claim 14, wherein the forming of the intermediate layer further comprises:
   forming the first portions of the intermediate layer in first regions; and
   forming the second portions of the intermediate layer in second regions that overlap the first regions.

16. The method of claim 15, wherein the forming of the emission layers further comprises forming red emission layers where the first regions and the second regions overlap.

17. The method of claim 14, wherein the forming of the first portions of the intermediate layer comprises: using a first mask having openings that correspond to each of the first portions to pattern the first portions.

18. The method of claim 14, wherein the forming of the second portions of the intermediate layer comprises using a second mask having openings that correspond to each of the second portions to pattern the second portions.

19. The method of claim 14, wherein the forming of the emission layers and the intermediate layer further comprises forming the emission layers within the intermediate layer.

20. The method of claim 19, wherein the forming of the intermediate layer further comprises:
   forming a hole injection layer on the first electrodes to a generally constant thickness; and
   forming a hole transport layer on the hole injection layer, such that a thickness of the hole transport layer varies according to the sub-pixels.

21. The method of claim 19, wherein the forming of the intermediate layer further comprises:
   forming a hole injection layer on the first electrodes, such that a thickness of the hole injection layer varies according to the sub-pixels; and
   forming a hole transport layer on the hole injection layer to a generally constant thickness.

22. The method of claim 19, wherein the forming of the intermediate layer further comprises:
   forming a hole injection layer on the first electrodes, such that a thickness of the hole injection layer varies according to the sub-pixels; and
   forming a hole transport layer on the hole injection layer, such that a thickness of the hole transport layer varies according to the sub-pixels.

23. The method of claim 14, wherein the forming of the emission layer and the intermediate layer further comprises:
   forming a first portion of the intermediate layer on the first electrodes;

forming the emission layers on the first portion;

forming a second portion of the intermediate layer on the emission layers, such that the thickness of the second portion varies according to the sub-pixels.

24. The method of claim 23, wherein the second portion is an electron transport layer.

25. A method of manufacturing an organic light-emitting display device having a plurality of pixels that are each divided into red, green, and blue sub-pixels, the method comprising:

forming first electrodes on a surface of a substrate;

forming emission layers and an intermediate layer on the first electrodes, wherein the forming of the emission layers and the forming of the intermediate layer comprises varying a thickness of the intermediate layer according to the sub-pixels as to cause resonance between the first electrodes and a second electrode when light is emitted; and forming the second electrode on the intermediate layer, wherein the forming of the intermediate layer further comprises, forming the intermediate layer as one piece in each of the pixels.

26. An organic light-emitting display device comprising:

a substrate;

pixels disposed on the substrate and divided into red, green, and blue sub-pixels; the pixels comprising:

a first electrode;

a second electrode;

an intermediate layer disposed between the first electrode and the second electrode, the intermediate layer having a thickness that varies according to the sub-pixels; and red, green, and blue emission layers disposed within the intermediate layer in the red, green, and blue sub-pixels, respectively, wherein, the red, green, and blue emission layers are spaced apart from each other, in each of the pixels, the red sub-pixel is disposed between the blue and green sub-pixels, and the thickness of the intermediate layer is at a maximum in the red sub-pixels.

27. The device of claim 26, wherein the intermediate layer comprises a hole injection layer, a hole transport layer, and an electron transport layer.

28. The device of claim 26, wherein the first electrode is reflective, and the second electrode is semi-transparent or transparent.

29. The device of claim 26, wherein a resonance occurs between the first electrode and the second electrode when light is emitted from the emission layers.

30. An organic light-emitting display device comprising:

a substrate;

pixels disposed on the substrate and divided into red, green, and blue sub-pixels; the pixels comprising:

a first electrode;

a second electrode;

an intermediate layer disposed between the first electrode and the second electrode, the intermediate layer having a thickness that varies according to the sub-pixels; and red, green, and blue emission layers disposed within the intermediate layer in the red, green, and blue sub-pixels, respectively, wherein, the red, green, and blue emission layers are spaced apart from each other, the red sub-pixels are disposed between the blue and green sub-pixels, the thickness of the intermediate layer is at a maximum in the red sub-pixels, and in each of the pixels, the intermediate layer is formed as one piece.

* * * * *